US009875325B2

(12) United States Patent
James et al.

(10) Patent No.: US 9,875,325 B2
(45) Date of Patent: Jan. 23, 2018

(54) COMPUTER IMPLEMENTED SYSTEM AND METHOD OF IDENTIFICATION OF USEFUL UNTESTED STATES OF AN ELECTRONIC DESIGN

(71) Applicant: ZIPALOG, INC., Plano, TX (US)

(72) Inventors: Felicia James, Carrollton, TX (US); Michael Krasnicki, Richardson, TX (US)

(73) Assignee: Zipalog, Inc., Plano, TX (US)

( * ) Notice: Subject to any disclaimer, the term of this patent is extended or adjusted under 35 U.S.C. 154(b) by 76 days.

(21) Appl. No.: 14/707,723

(22) Filed: May 8, 2015

(65) Prior Publication Data

US 2016/0328505 A1 Nov. 10, 2016

Related U.S. Application Data

(60) Provisional application No. 61/991,069, filed on May 9, 2014.

(51) Int. Cl.
G06F 17/50 (2006.01)
(52) U.S. Cl.
CPC .................. G06F 17/5036 (2013.01)
(58) Field of Classification Search
CPC ....................................... G06F 17/5036
USPC ......................................... 716/106
See application file for complete search history.

(56) References Cited

U.S. PATENT DOCUMENTS

| 7,292,970 | B1 * | 11/2007 | Hurlock | G01R 31/31835 703/13 |
|---|---|---|---|---|
| 7,502,728 | B1 * | 3/2009 | Hurlock | G01R 31/31707 703/13 |
| 8,195,439 | B1 | 6/2012 | Hussain | |
| 8,554,530 | B1 | 10/2013 | O'Riordan et al. | |
| 8,739,089 | B2 * | 5/2014 | Chiu | G06F 17/5054 702/123 |
| 2001/0011212 | A1 * | 8/2001 | Raynaud | G06F 17/5022 703/22 |
| 2011/0054875 | A1 | 3/2011 | Chang et al. | |
| 2012/0198405 | A1 | 8/2012 | Bhushan et al. | |
| 2012/0317534 | A1 | 12/2012 | Bhinge | |
| 2016/0328505 | A1 * | 11/2016 | James | G06F 17/5036 |

OTHER PUBLICATIONS

PCT: International Search Report and Written Opinion of PCT/US2015/030137 (related application); dated Aug. 4, 2015; 23 pgs.
PCT: International Preliminary Report on Patentability of PCT/US2015/030137 (related application); dated Nov. 24, 2016; 18 pgs.

* cited by examiner

Primary Examiner — Suresh Memula
(74) Attorney, Agent, or Firm — Munck Wilson Mandala LLP

(57) ABSTRACT

A computer implemented system and method of identification of useful untested states of an electronic design, comprising, parsing at least one netlist of a representation of the electronic design comprised at least in part of at least one analog portion, determining at least one instrumentation point based on the at least one netlist, generating at least one instrumented netlist based on the at least one instrumentation point and determining an analog verification coverage utilizing the at least one instrumented netlist.

12 Claims, 30 Drawing Sheets

COMPUTER IMPLEMENTED SYSTEM AND METHOD OF IDENTIFICATION OF USEFUL UNTESTED STATES OF AN ELECTRONIC DESIGN

CROSS-REFERENCE TO RELATED APPLICATIONS

This application claims the benefit of U.S. Provisional Application No. 61/991,069, filed on May 9, 2015, entitled COMPUTER IMPLEMENTED SYSTEM AND METHOD OF IDENTIFICATION OF USEFUL UNTESTED STATES OF AN ELECTRONIC DESIGN, the specification of which is incorporated herein by reference in its entirety.

BACKGROUND

The method and system are generally related to the verification of analog and mixed signal integrated circuits and is particularly useful in, but not limited to instrumenting an electronic design to assess completeness of verification and identify useful untested states.

Electronic design automation (EDA) is software for designing electronic blocks. There are several broad types of electronic signals, components and blocks: digital, analog and a mixture of digital and analog termed mixed signal. The electronic design generally comprises at least one of the following levels of circuit information: a system level, an architectural level, a dataflow level, an electrical level, a device level and a technology level and/or the like.

Digital signals have discrete input and output values "0" and "1", occurring at discrete time values, typically tied to a clock signal. Digital components which input and output the digital signals typically have static pin outs and interaction protocols. Digital blocks comprised of the digital components have well established and well documented physical layouts and electrical interactions. Simulators for digital blocks are discrete time event driven simulators.

Analog signals generally have continuous input and output values that may vary over time. Analog components typically have customizable layouts in order to modify inputs, outputs, triggers, biases, etc. Therefore, due to customization, analog blocks comprised of the analog components may not have as well established or well documented physical layouts or electrical interactions as digital circuits. Simulators for analog blocks generally necessitate continuous time domain simulators.

Mixed signal blocks are a combination of digital signal blocks and analog signal blocks within a component being simulated. The most common options available for simulation are to simulate the component as a grouping of analog blocks, or to separately analyze the analog components/blocks and the digital components/blocks and translate the inputs and outputs at the boundaries of the digital and analog domains for inter-domain communication.

Within EDA there are two broad categories of circuit review that are often related: simulation and verification. Simulation is a numerical solution set that predicts the behavior of a circuit. Verification is the systematic pursuit of describing the behavior of a circuit under relevant conditions (functional verification) and over manufacturing process variation (parametric verification). Therefore, verification generally necessitates a much more extensive review of the circuit, its operating conditions, and manufacturing operation variations than a simulation. It is possible to run a large number of simulations without verifying to any significant degree the functionality of a circuit. Verification is the mathematical modeling of circuit behavior and evaluation of circuit performance over a range of conditions. Ultimately, the measure of success of verification is to report how well the circuit design complies with the circuit specification. Analog and mixed signal verification methodology is struggling to keep pace with the complexity, cost, and computational demands of ever-growing analog and mixed signal circuits.

The number and complexity of verification test cases grows with the complexity of analog and mixed signal designs. Additionally, simulation speed decreases and memory utilization increases as the size of the circuit grows. Thus, the computational processing-power to verify a circuit may dramatically increase with circuit complexity. To make this issue more painful, verification normally occurs at the end of a design cycle where schedule delays are perceived to be most severe. Thus, verification is an activity that generally necessitates a significant amount of simulation processing-power for a small part of the overall design cycle, and therefore an efficient use of verification resources is generally necessitated to meet time to market demands.

Today's complex verification solutions specifically focus engineering on the verification activity to ensure that the operation of the circuit is fully and efficiently verified under pertinent conditions. This focused analog and mixed signal verification is much more manual and experience driven than digital verification. This sporadic interactive analog verification leaves companies at risk. The present disclosure may allow verification tasks to be defined at a higher level of abstraction. The present disclosure may allow efficient capture of complex relationships between stimulus or stimulus assertions and output measurements or output assertions. The present disclosure may allow the test of transistor level circuits, circuits implemented with behavioral models, or circuits that contain a combination of behavioral models and transistor level implementations. The methods used presently for modeling analog and mixed signal circuits are not efficient for minimizing the number of verification runs to exercise the valid states. This is due at least in part to the fact that the netlist is insufficiently instrumented to efficiently record the states exercised. A netlist describes the connectivity of the electronic design. There is a long felt need for instrumenting a netlist to identify valid useful untested states of the electronic design.

Robust verification of analog and mixed signal circuits generally necessitates a significant investment in test benches, performance analysis routines, and macro-models that may be used to accelerate the simulations. The complexity of this collateral grows with the complexity of the analog and mixed signal integrated circuits to be verified. As a design team adds design resources it also needs to add verification resources, adding to the cost of the design. The efficient use of those resources becomes paramount due to the inevitable time constraints that are imposed at the end of the design cycle, when companies are trying to get a product to market.

The current technology trajectory, within the electronics manufacturing industry, is to move more and more toward single chip designs, called Systems on a Chip (SoC), or multi-chip modules (MCM) where multiple chips are included in one package. Most systems on a chip and multi-chip modules generally necessitate some level of mixed signal verification. As mixed signal designs continue to increase in size and complexity, this places additional burdens on verification to insure first pass design success and reduce the time-to-market. Although the complexity of analog and mixed signal ASIC design has followed Moore's law, innovations in design verification generally have not.

Valuable design time and computational resources as well as expensive simulator resources may be specifically focused by the disclosed method for instrumenting the netlist in order to ascertain the minimum verification runs necessary to test valid states. The method makes assessment of global verification more efficient. The resulting minimized run list allows more efficient use of resources.

This disclosure is related to instrumenting a netlist of an electronic design for analog and mixed signal (A/MS) application specific integrated circuits (ASICs). Analog and mixed signal integrated circuits exist in many modern electronic devices, and these circuits needs to be verified through simulation prior to fabrication.

SUMMARY

There is provided according to, just one exemplary embodiment and it's aspect of the present disclosure of a computer implemented system and method of identification of useful untested states of an electronic design, comprising parsing at least one netlist of a representation of the electronic design comprised at least in part of at least one analog portion, determining at least one instrumentation point based on the at least one netlist, generating at least one instrumented netlist based on the at least one instrumentation point and determining an analog verification coverage utilizing the at least one instrumented netlist.

BRIEF DESCRIPTION OF THE DRAWINGS

The present disclosure will be more clearly understood from consideration of the following detailed description and drawings in which.

Figure 1:
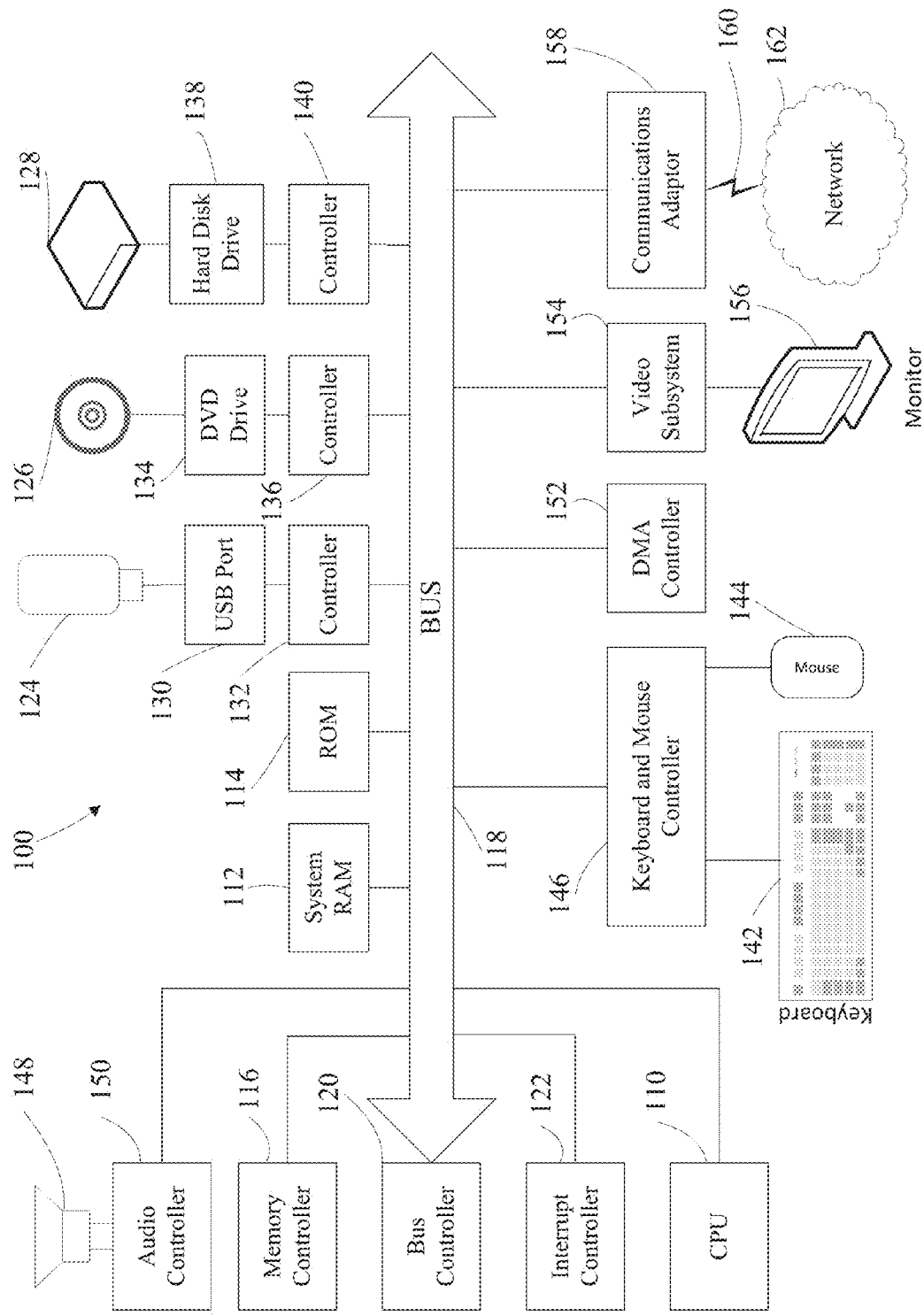
FIG. 1 is a block diagram showing a computer system suitable for practicing the instant disclosure.

References in the detailed description correspond to like references in the various drawings unless otherwise noted. Descriptive and directional terms used in the written description such as right, left, back, top, bottom, upper, side, et cetera, refer to the drawings themselves as laid out on the paper and not to physical limitations of the disclosure unless specifically noted. The drawings are not to scale, and some features of examples shown and discussed are simplified or amplified for illustrating principles and features as well as advantages of the disclosure.

DETAILED DESCRIPTION

The features and other details of the disclosure will now be more particularly described with reference to the accompanying drawings, in which various illustrative examples of the disclosed subject matter are shown and/or described. It will be understood that particular examples described herein are shown by way of illustration and not as limitations of the disclosure. Furthermore, the disclosed subject matter should not be construed as limited to any of examples set forth herein. These examples are provided so that this disclosure will be thorough and complete, and will fully convey the scope of the disclosed subject matter to those skilled in the art. The principle features of this disclosure may be employed in various examples without departing from the scope of the disclosure.

The terminology used herein is for the purpose of describing particular examples only and is not intended to be limiting of the disclosed subject matter. Like number refer to like elements throughout. As used herein the term "and/or" includes any and all combinations of one or more of the associated listed items. Also, as used herein, the singular forms "a", "an", and "the" are intended to include the plural forms as well, unless the context clearly indicates otherwise. It will be further understood that the terms "comprises", and/or "comprising" when used in this specification, specify the presence of stated features, integers, steps, operations, elements, and/or components, but do not preclude the presence or addition of one or more other features, integers, steps, operations, elements, components, and/or groups thereof. Also, as used herein, relational terms such as first and second, top and bottom, left and right, and the like may be used solely to distinguish one entity or action from another entity or action without necessarily requiring or implying any actual such relationship or order between such entities or actions.

Cost of entry barriers into analog and mixed signal IC design is endemic especially to fabless companies that are developing ASIC intellectual property in the form of packaged ASICs or modules to be integrated into their customer's Systems-on-Chip (SoCs) or multi-chip modules (MCMs). For example, if a fabless design center is staffed with five IC design engineers, equipping the team with design tools is financially equivalent to quadrupling the staff. This is due to the high cost of ownership of the EDA tools, not just in annual license fees, installation and support, training and the like. Reducing system use through instrumentation of the netlist to capture valid state verification data allows more efficient resource allocation.

Analog and mixed signal verification is time and computationally intensive. Functionality of the circuit for various inputs, at various conditions and for various manufacturing conditions are generally necessitated to be simulated to insure that the circuit functions to the specifications.

Prior to running a simulation of an electronic design, the electronic design undergoes a conversion to a netlist which describes the connectivity of the electronic design. The netlist whilst describing the connectivity of the circuit does not include metadata pertaining to the circuit.

The disclosed system and method of instrumentation of an electronic design instruments the netlist to capture metadata pertaining to the verification. This captured metadata in conjunction with generation of valid states from the specification allows an assessment of the completion of the verification of the electronic design.

AMST™ (Analog Mixed Signal Test) is a module for specifying analog/mixed-signal (A/MS) stimulus as well as assertions and output measurements. An AMST is able to efficiently capture complex relationships between stimulus and output assertions. Verification models specified in the AMST Language (AMSTL™) captures higher level commands that are subsequently translated into Verilog-A/AMS. Verilog-A, Verilog-AMS, VHDL-AMS, SystemC-AMS or the like, which are standardized languages for defining analog and mixed-signal, respectively. It is envisioned that the code could also be used to generate any language standard that supports direct branch contribution statements for analog simulators.

AMSTL can be used to capture higher level commands with IBCS regardless of whether the resulting translated code will be used in the behavioral model of a circuit or a test harness. The value of capturing assertions within an AMST rather than in the behavioral model of the circuit is that the verification commands can be reused regardless of the representation of the circuit. For example, in FIG. 17 the AMP_AMST block will execute the same commands and assertions whether the op amp and mux are represented as transistor level schematics or behavioral models. The AMP_AMST now serves as verification intellectual property (VIP) that can be reused with these circuits. This concept becomes especially valuable when considering the case of providing analog design intellectual property (IP) to a third party. The purchasing party now has verification IP that can be embedded with the purchased IP within a larger SOC. This VIP reduces the risk that the purchased design IP will be used incorrectly. Verification IP has been a proven concept for digital circuits and top-level inputs and outputs but has not been previously practical to provide with embedded analog IP.

The language AMSTL is intended to describe behaviors, stimulus, outputs, measurements, etc. for analog mixed signal integrated circuit design and provides higher level constructs than available in standard hardware description languages that are intended for input into analog simulators. One benefit is an efficiency improvement based on the availability of IBCS in AMSTL. Additionally, AMSTL code can be parsed to output any desired standard language. The module AMST is a behavioral model of analog mixed-signal verification intellectual property and is intended to reside at any level of the hierarchy within the design. The module may reside with the IP that it is monitoring, stimulating and/or evaluating. The output form of the model (in Verilog-A, Verilog-AMS, VHDL-AMS, etc.) can be input through a netlist into an analog or mixed-signal simulator.

A netlist is a representation of one or more databases that contain information relevant to a verification project and simulation task including but not limited to:

1) a description of components (e.g. transistors, resistors, capacitors, behavioral model, AMSTs, digital gates) and properties of components that make up the design (e.g. PMOS2 has W=1 um),
2) the connectivity of the design (e.g. drain of PMOS1 is connection to gate of NMOS2),
3) hierarchical configuration of the design for a specific simulation task (e.g. PLL1 is represented as a model, LDO3 is represented at the transistor level)
4) configuration of the simulation task including simulation type (e.g. transient simulation), duration (e.g. 2 ms), tolerance settings (e.g. iabstol <10e-10), configuration of interface elements between digital and analog partitions, and output signal selections
5) any information in the verification database such as expected performance values, signal transitions, signal shape, duty cycle, etc of any signal or element of interest to the verification activity).

The netlist is the input to a simulation. The purpose of a simulation is to predict the behavior of the circuit described in the netlist subject to the stimulus conditions and accuracy criteria specified in the netlist. Simulation is an essential part of integrated circuit (IC) design since a) photomasks for IC designs are very expensive b) IC manufacturing takes a long time, c) probing of signals internal to an IC is extremely difficult and d) bread-boarding of modern IC designs is impractical. A simulation is performed with a simulator. At a high level, there are three approaches to simulating an integrated circuit: SPICE-level simulation, digital-level simulation, and mixed-mode simulation. A SPICE-level simulator reduces the netlist to a set of nonlinear differential algebraic equations which are solved using implicit integration methods, Newton's method, and sparse matrix techniques. A SPICE-level simulator conserves charge, satisfies Kirchhoff's Current Law and Kirchhoff's Voltage Law, subject to a set of absolute or relative tolerances. A digital simulator reduces the netlist to a set of boolean functions which are triggered by discrete events. Digital simulators do not conserve charge, satisfy Kirchhoff's Current Law or Kirchhoff's Voltage Law. But they can simulate much larger circuits at a higher level of abstraction. Mixed-mode (AMS) simulation combines a SPICE-level simulator with a digital simulator. In this type of simulation a SPICE-level simulator is used to simulate a portion of the design, predicting the net voltages and terminal currents of the components in the SPICE-level partition, while the digital simulator is used to predict the digital outputs of the components in the digital partition. In a mixed-mode simulation, the SPICE-level partition and the digital partition are connected with interface elements which, at a basic level, are idealized 1-bit analog to digital converters (for signals going from the SPICE partition to the digital partition) and 1-bit digital to analog converters (for signals going from the digital partition to the SPICE partition).

A simulation can produce the following outputs:
1) continuous-time/continuous-value waveforms of net voltages and terminal currents
2) discrete-time/discrete-value digital waveforms of logic net outputs
3) any data written by any behavioral model including any AMST modules that have been included into the netlist
4) assertion violation messages
5) debug information about model behavior, circuit convergence difficulties, etc.

These outputs from the simulation are stored in one or more databases. These outputs are subsequently used to evaluate the suitability of the circuit. This process can be manual. A designer can, for example, review waveforms in a graphical waveform viewer. The process can also be automated. A software program can programmatically analyze waveform results and AMST outputs to build a spec compliance matrix which summarizes the set of design objectives that have been satisfied and the set of design objectives that have been failed in the circuit simulation.

An instrumentation point may be:
1) any component in the netlist (e.g. transistors, resistors, capacitors, behavioral model), or
2) any net that defines some aspect of the connectivity of the design, or
3) any arbitrary set of one or more components and zero or more nets, or
4) any arbitrary set of zero or more components and one or more nets.

Figure 17:
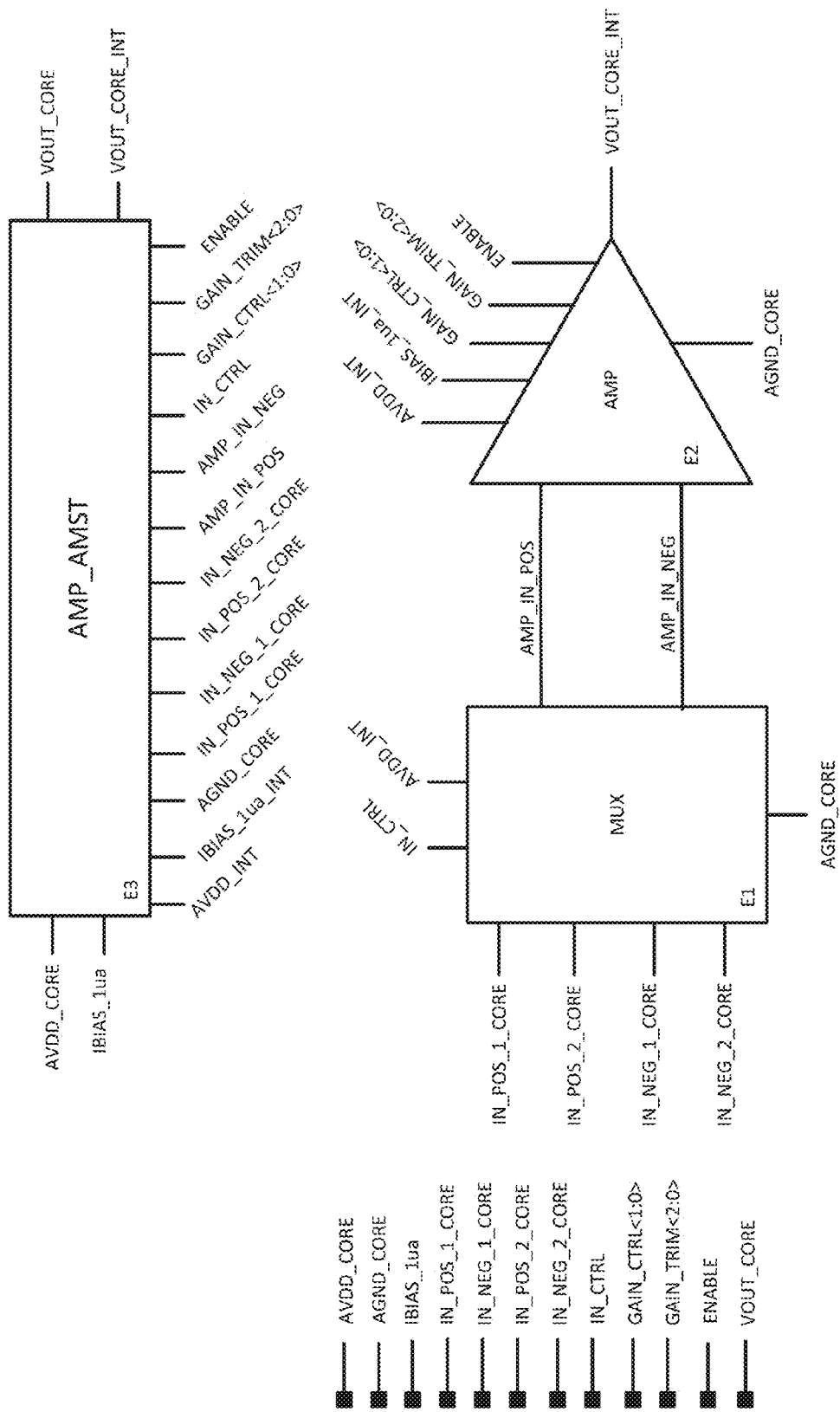
FIG. 17 depicts an E level example of an electronic design.

Instrumentation points can be created in one of three ways:
1) Manually specified by the user of the system. In this usage scenario, the user manually identifies instrumentation points. This can be accomplished from the user's schematic capture environment. As a simple example, the user could select two nets as an instrumentation point. The instrumentation module, called an AMST, can be implemented in Verilog-A/AMS or any other hardware description language. In the instrumentation module the user can specify the shape, behavior, or transfer function between the two nets that identifies a desirable or undesirable mode or operation. A more complex example, consisting of many nets, is shown in FIG. 17. Once specified, the software can track coverage of these desirable or undesirable behaviors.
2) Programmatically identified from programmatically described patterns. Analog and mixed-signal circuits frequently have repeating topological patterns such as the current mirror consisting of M1 and M2 in FIG. 11. In this topology, the current through M2 is a fixed ratio of I_REF if certain conditions are satisfied. These topologies can be programmatically identified, assertions or AMSTs for these topologies can be automatically generated and these assertions or AMSTs can be automatically instrumented to measure coverage for the topological pattern. Static patterns for identifying circuit function can incorporate circuit topology (specific connections between specific device terminals), device names and types, device properties (such as device model names), net names and net properties (such as net width).
3) Programmatically derived from aggregated analytic information. Static analysis of netlist constructs is limited as a mechanism for deriving circuit function as the same circuit topology can used for different applications (with different biasing or stimulus). To overcome this problem, additional instrumentation points can be derived from historical analytic information such as known-good simulation results. For example, a program can analyze the simulation results from the current mirror in FIG. 12, determine that the current flowing from source to drain of M4 is in a certain range, automatically generate assertions or AMSTs for this particular instance of the circuit in a larger design. These assertions or AMSTs can then be automatically instrumented to measure coverage for the topological patterns.

Instrumentation can be accomplished in two different ways:
1) Instrumentation of Existing Behavioral Models and AMSTs. Behavioral model and hand-written AMSTs are very useful because they capture a mathematical description of the desired function of the circuit. Behavioral models implement the desired function directly. AMSTs describe circuit function indirectly through a set of assertions that test circuit response to a specified stimulus. Both can be instrumented for coverage by a) tracking the execution of conditional branch statements in the model and/or b) dividing any transfer function implemented in the model into distinct regions and tracking the use of each region. A simple example of a conditional branch statement is an if-then-else clause in Verilog-A/AMS. To measure coverage, the software tracks how many of the conditional branches in each instance of each behavioral model are executed in the verification simulation. The transfer function resulting from the model can also be analyzed to identify any discontinuities in the transfer function, its first, second, third, fourth, or arbitrary n-th derivative. Any identified discontinuity is used to partition the model into regions of operation. To measure coverage, the software tracks the number of regions of operation reached for each instance of each model in the verification simulation.
2) Automatic Insertion of Instrumented AMSTs. For transistor-level circuits the desired function is not always known. As described above, an AMST module for an instrumentation point can be automatically generated from static analysis of the netlist or aggregated analytic information that can incorporate known-good simulation results, simulation configuration, user inputs, or observed user behavior. Once the module is generated, it can be added into the netlist by adding an instance of the new module in the appropriate part of the netlist, connecting voltage measurement nets, and splicing any nets where current measurement is required. Once connected, the AMST can be instrumented as described above.

Therefore the disclosed system and method of translation of instrumentation of an electronic design may solve one or more of the following issues, to allow more efficient use of computer and personnel resources through reduced verification run overlaps, to reduce the time lag to market and/or to insure a more focused and thorough verification confirmation.

Computer System FIG. 1 illustrates the system architecture, for an exemplary computer system 100, on which the current disclosure may be implemented. The exemplary computer system of FIG. 1 is for descriptive purposes only. Although the description may refer to terms commonly used in describing particular computer systems, such as a personal computer, the description and concepts equally apply to other systems, including systems having architectures dissimilar to FIG. 1.

Computer system 100 typically includes a central processing unit (CPU) 110, which may be implemented with one or more microprocessors, a random access memory (RAM) 112 for temporary storage of information, and a read only memory (ROM) 114 for permanent storage of information. A memory controller 116 is provided for controlling RAM. A bus 118 interconnects the components of the computer system. A bus controller 120 is provided for controlling the bus. An interrupt controller 122 is used for receiving and processing various interrupt signals from the system components. Mass storage may be provided by flash 124, DVD 126, or hard disk 128, or, for example a solid-state drive. Data and software may be exchanged with the computer system via removable media such as the flash drive and DVD. The flash drive is insertable into a Universal Serial Bus, USB, drive 130, which is, in turn, connected to the bus by a controller 132. Similarly, the DVD is insertable into DVD drive 134, which is, in turn, connected to bus by controller 136. Hard disk is part of a fixed disk drive 138, which is connected to the bus by controller 140.

User input to the computer system may be provided by a number of devices. For example, a keyboard 142 and a mouse 144 are connected to the bus by a controller 146. An audio transducer 148, which may act as a microphone and a speaker, is connected to bus by audio controller 150, as illustrated. Other input devices, such as a pen and/or tabloid, may be connected to the bus and an appropriate controller and software. DMA controller 152 is provided for performing direct memory access to the system RAM.

A visual display is generated by video subsystem 154, which controls video display 156. The computer system also includes a communications adaptor 158, which allows the system to be interconnected to a local area network (LAN) or a wide area network (WAN) or other suitable network, schematically illustrated by a bus 160 and a network 162.

Operation of the computer system is generally controlled and coordinated by an operating system, such as the Windows, Windows 7 and Windows 8 operating systems, available from Microsoft Corporation, Unix, Linux or Apple OS X operating system, to name a few. The operating system controls allocation of system resources and performs tasks such as processing scheduling, memory management, networking, and I/O services, among other things.

Figure 2:
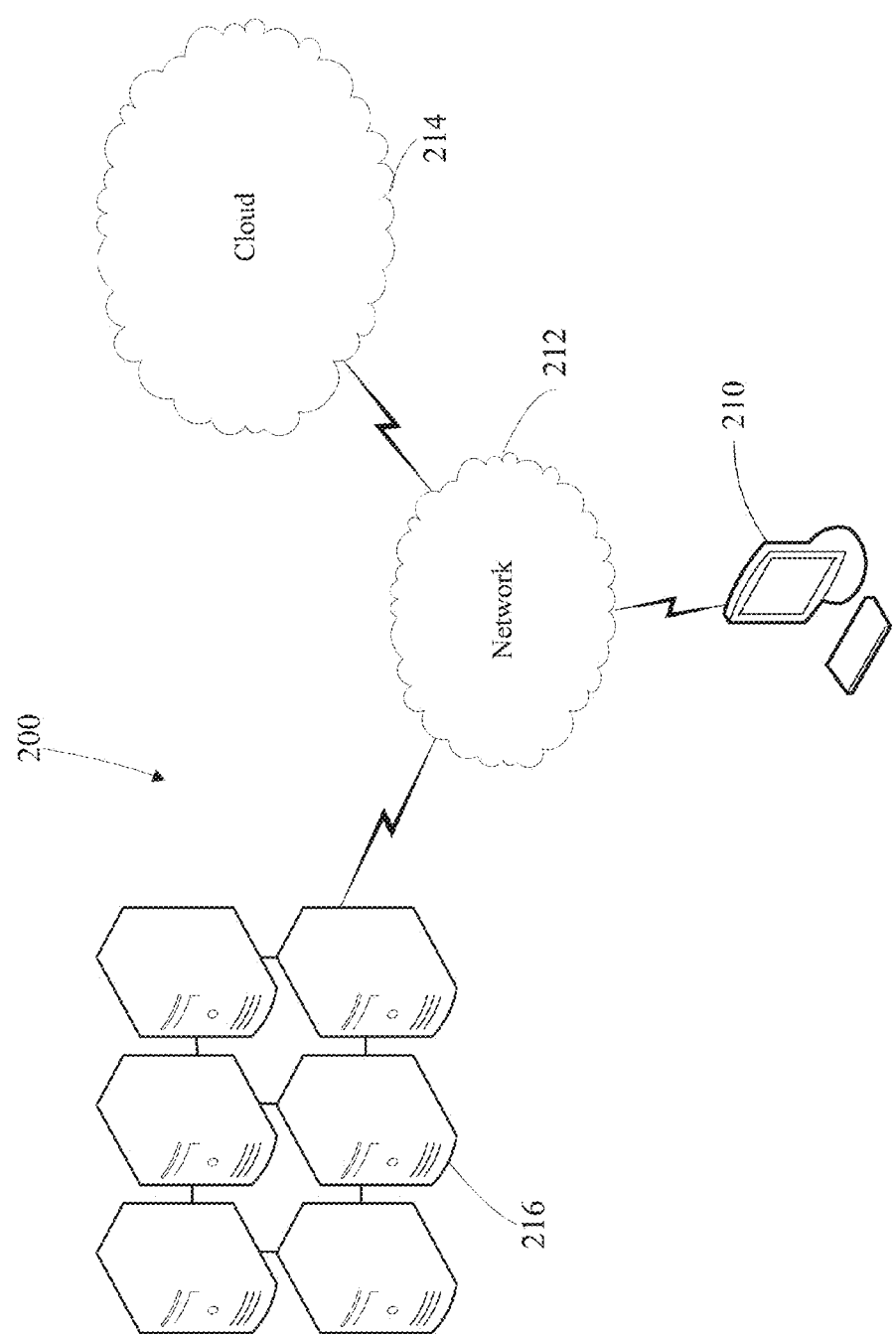
FIG. 2 is a block diagram showing a computer network system suitable for practicing the instant disclosure.

Computer System FIG. 2 illustrates the system 200 in which the computer user 210 is connected to a network 212 which in turn is connected to the cloud 214 and the compute farm 216.

Figure 3:
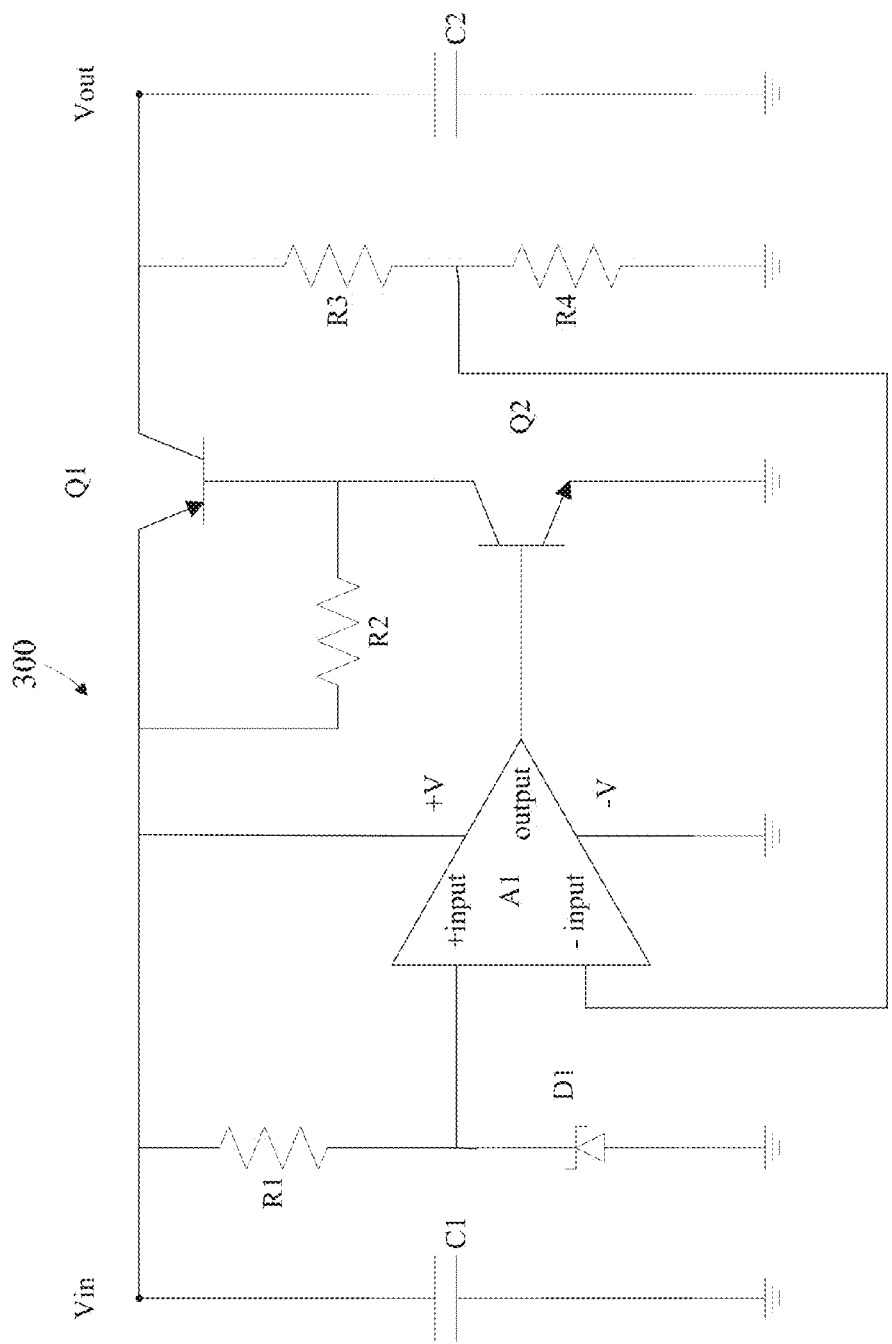
FIG. 3 depicts an example Low Voltage Dropout (LDO) circuit.

In an example schematic of a circuit to be verified/analyzed, a low voltage dropout (LDO) 300 circuit is shown in FIG. 3. The LDO has an amplifier A1, having an inverting input (−input), a non-inverting input (+input) an output, a positive voltage input +V and a negative voltage input −V. The LDO circuit has a voltage in Vin and a voltage out Vout. The LDO has a power out block Q1, Q2 and R2. The LDO feedback circuit is comprised of R3, R4, D1 and R1. The amplifier A1 is termed a symbol, the elements D1, R1, R2, R3, R4, C1, C2, Q1 and Q2 are referred to as primitives.

Figure 4:
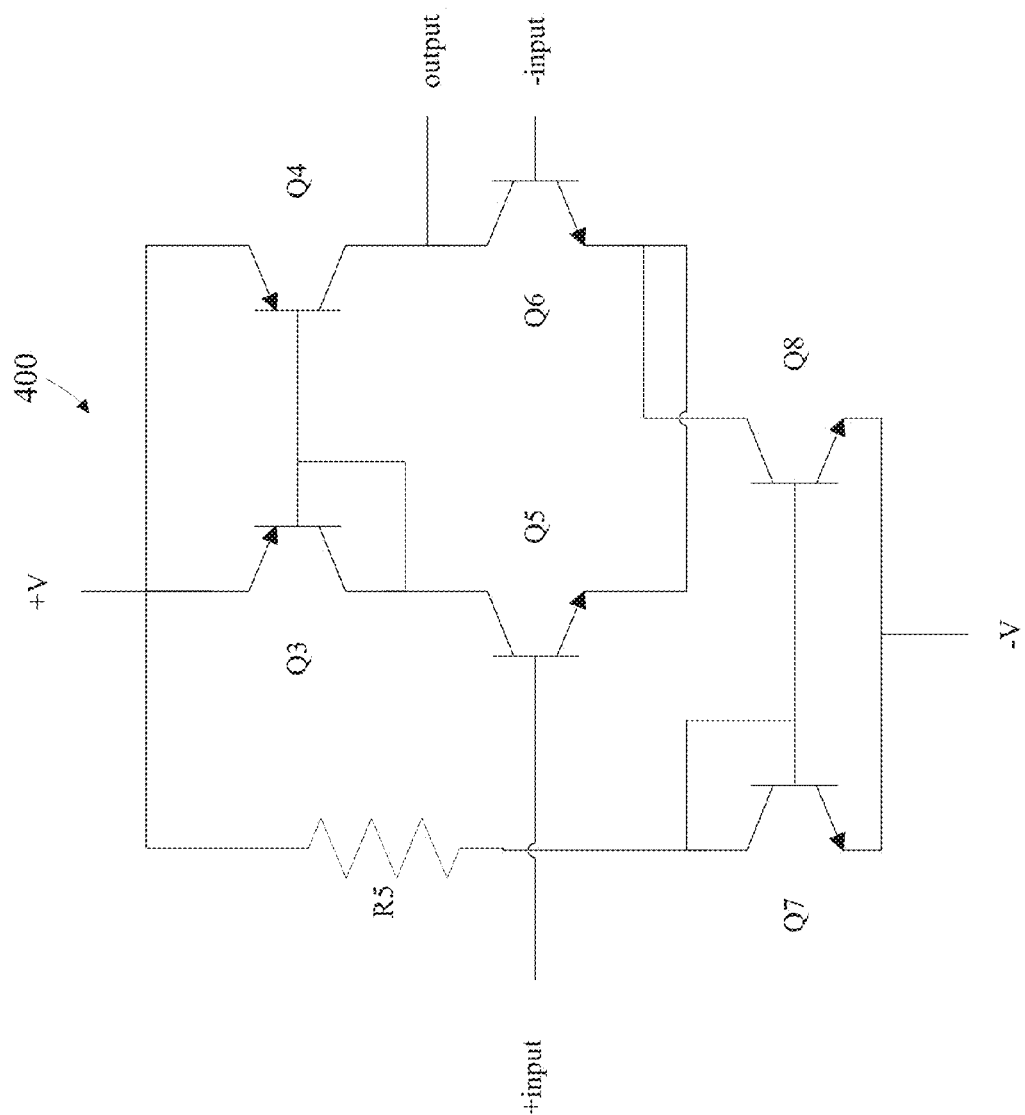
FIG. 4 depicts an example amplifier circuit.

An example schematic of an amplifier A1 400 circuit is shown in FIG. 4. The symbol of the amplifier is comprised of transistors Q3, Q4, Q5, Q6, Q7 and Q8 and resistor R5. The amplifier A1, having an inverting input (−input), a non-inverting input (+input) an output, a positive voltage input +V and a negative voltage input −V.

Figure 5:
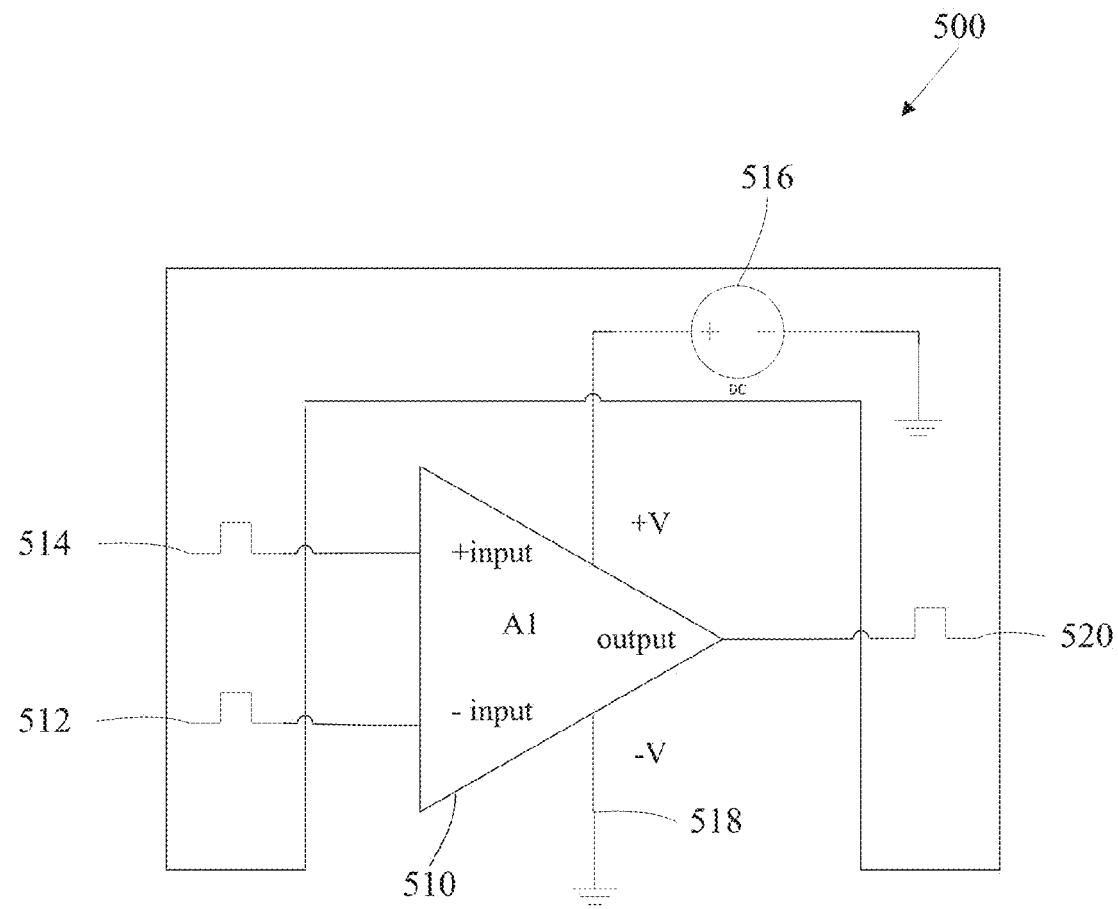
FIG. 5 depicts a test bench pin out for an amplifier.

FIG. 5 shows a test bench 500 for amplifier A1 510. A test bench is a specific configuration of inputs, outputs, test conditions and the like that are run for a device to which it is connected. The test bench has an inverting input 512, a non-inverting input 514, a positive power input 516, a negative power input 518 and an output 520. The test bench has associated connections, power supplies, IOs, etc. which are referred to as the test bench collateral. The portion around the periphery of the circuit is referred to as the verification harness. Pin outs and the operation of the verification harness need to be matched to the circuit under test.

Figure 6:
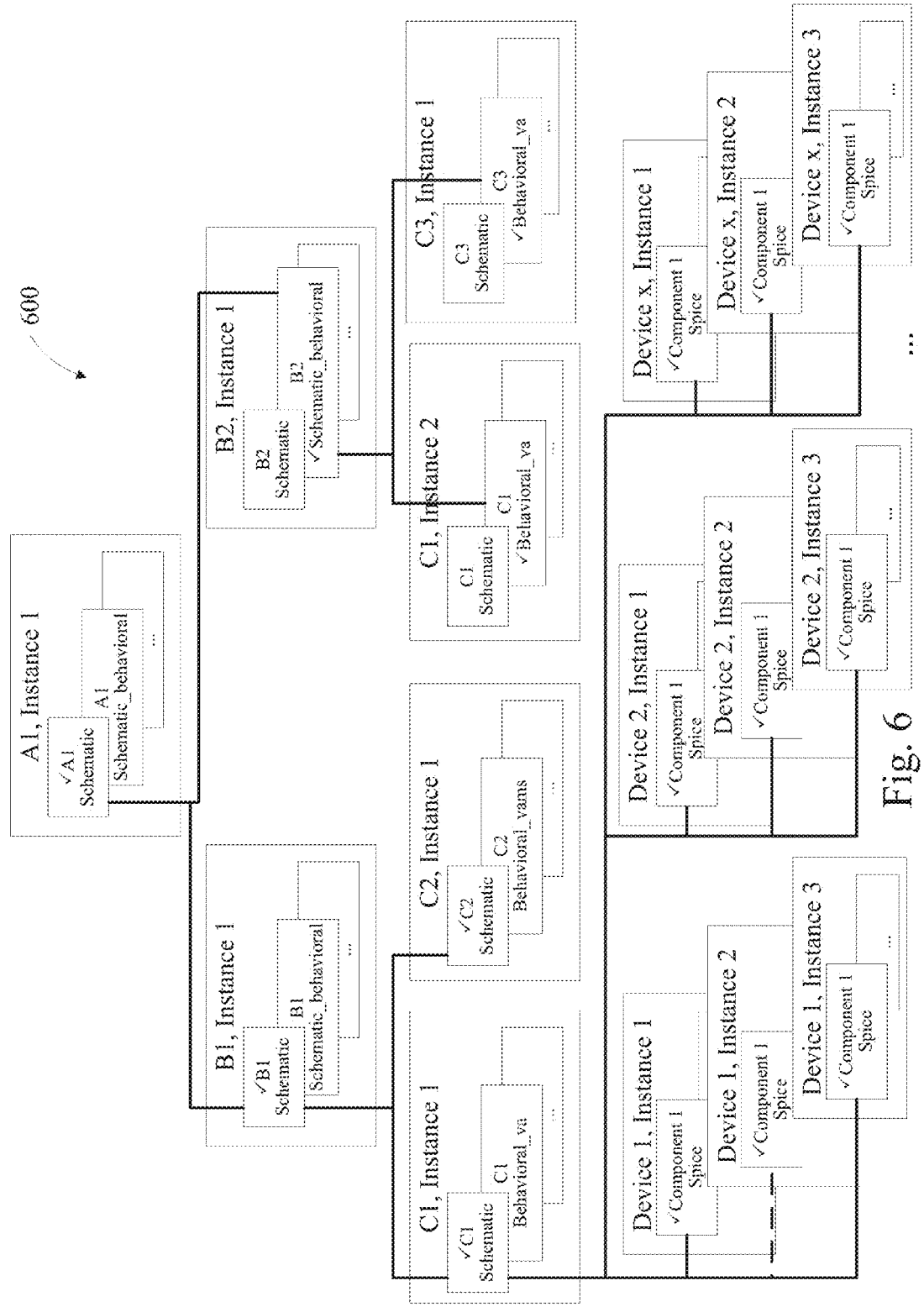
FIG. 6 depicts a general example hierarchy.

FIG. 6 shows a general example hierarchy 600 of a Test bench with a device under test, DUT. The hierarchy is arranged according to levels, A, B, C and Device and according to instances 1, 2 and 3. The connecting lines indicate which models are connected throughout the hierarchy for a specific verification. Within level and instance, multiple view types may exist. The examples illustrate some possible hierarchical configurations and are not intended to limit the cases and views or view types.

Integrated circuit design hierarchy is the representation of integrated circuit designs utilizing hierarchical representations. This representation allows for more efficient creation of complex designs that may include millions of components such as transistors, resistors, and capacitors as well as the metal lines that connect the devices. The design hierarchy representation used at any given point in the design process may vary based on the design step being performed and the type of design function such as analog, digital, or memory.

In the case that a design is to be manufactured, a layout of the design is created so that a representation may be mapped. This mapping allows patterns to be created on individual levels of the mask sets to allow design manufacture. In general, the design flow to create the layout representation is very different for analog as compared to digital functional blocks and subsystems.

Early in the design process, there may be large portions of the design that are designed for the first time and do not have any existing layout representations. Other portions of the design may already have been proven, and these may be represented at a higher level of abstraction or in combination may include the layout representation, or may be stock items not even coming from the same design house.

Some common types of design representations referred to here as views may comprise various view types. A Schematic view type is a picture of components or blocks with connectivity shown by lines or nets and connections to other levels of the hierarchy through pins. A Spice view type is a representation of a component and its associated parameters, possibly including a specific device model that will be instantiated into the spice netlist. An LVSExtract is a view type that is created by a tool analyzing the layout view and reverse engineering the individual components and connectivity. Variations of this type of view may also include extracted parasitic components resulting from the physical layout that were not drawn by the designer. A Layout view type is a representation of the specific geometries including routing for that portion of the design. A Verilog™ view type is a text file that is in standardized Verilog™ format. A Verilog-A™ view type is a text file in standardized Verilog-A™ syntax. A Verilog-AMS™ view type is a text file in standardized Verilog-AMS™ syntax. View type names may be different depending on the electronic design automation tool provider, examples of which include SpectreHDL and HDL-A.

Other types of view types may help organization and readability of the hierarchy. As an example, graphic design tools such as schematic capture systems may use a Symbol view type for the graphic that is placed. The symbol may contain pins that connect the instance through the hierarchy as well as a drawing that indicates the function of the block. Examples include common symbols for operational amplifiers, basic digital gates, transistors, resistors, and the like.

Further adding to the complexity of description, a given block at a level of the design hierarchy may include multiple views of the same view type. An example would be different Verilog™ representations of a given block, for instance, one with annotated timing based on the layout, one with estimated timing, one without timing, or different levels of design representation such as gate-level or register transfer level (RTL). Similarly, an analog view may have numerous schematic views: for instance, one that will map to the final transistor-level design, one that includes placement of behavioral blocks for higher level modeling, one that may include parasitic elements from the layout, one that includes interface elements between analog and digital blocks for mixed-signal simulation. Also, for analog blocks there may be multiple Verilog-A™ or Verilog-AMS™ model views for the same block where models include different functionality and accuracy based on the purpose of different simulation exercises. These multiple views and view types are mapped into configurations that are used for a specific task or analysis.

Often view names are created to provide hints for what types of analysis a specific view may be useful. View name may include those listed hereinafter and the like. A Schematic is a schematic view including the placement of blocks that may be evaluated at the transistor level or at some level of the hierarchy such as a behavioral model. A Schematic_behavioral is a schematic view that comprises behavioral elements. A Schematic_parasitics is a schematic view that includes parasitic components extracted or estimated from the layout. A Spice is a spice view that includes the information implemented in a netlist and a component for a specific analog simulator. A Behavioral_va is a text view in the Verilog-A™ format that models a specific block for an analog simulator that may evaluate Verilog-A™, and a Behavioral_vams is a text view in the Verilog-AMS™ format that models a specific block for a mixed-signal simulator that may evaluate Verilog-A™ and Verilog.

In the specific example shown in FIG. 6, general example hierarchy, with device under test A1, Instance 1, would be defined based on the following configuration: A1, Instance 1 and B1, Instance 1 are modeled with a Schematic level model. B2, Instance 1 is modeled with a Schematic_behavioral model, and C1, Instance 1 and C2 Instance 1 are modeled using a Schematic model. C1, Instance 2 and C3, Instance 1 are modeled with a Behavioral_va model. At the bottom of the hierarchy, Devices 1, 2 and 3, instances 1, 2 and 3 are modeled using Spice.

In the specific example shown in FIG. 6, Device 1, Instance 2 is a dummy device and therefore would not change the simulator matrix. Device 1, Instance 2 is placed in the C1, Instance 1 schematic connected as a dummy device and is therefore not part of the A1, Instance 1 matrix that would be stamped in the simulator.

Whether a change necessitates a verification to be rerun is determined in part by the connections through the hierarchy. In this specific example for general example hierarchy, device under test A1, Instance 1, if Device 1, Instance 2, Schematic view is changed the simulator would not need to be rerun, since the device is a dummy device and would not modify the matrix that would be stamped into the simulator.

With a view to FIG. 6, C1, Instance 1 Schematic view forms part of the configuration of the simulator model, and if it is changed and the change is substantive enough to affect the simulator matrix, Test bench 1 would need to be rerun. C1, Instance 2 Schematic view would not form a part of the configuration of the simulator model example, therefore if it is changed, Test bench 1 would not need to be rerun.

At a more abstract level, if C1, Schematic view is changed, therefore changing the schematic view in Instance 1 and 2, which affects a change in the information stamped in the simulator matrix, Test bench 1 would need to be rerun. If a non-substantive change to C1, Schematic view is made for example by adding a comment and no change is made to the information stamped by the simulator in the matrix, this design configuration would not need to be rerun. It is apparent that determining whether a change was made to a configuration and the effect of the stamping of the matrix, may have a large effect on the number of necessitated verification runs.

Figure 7:
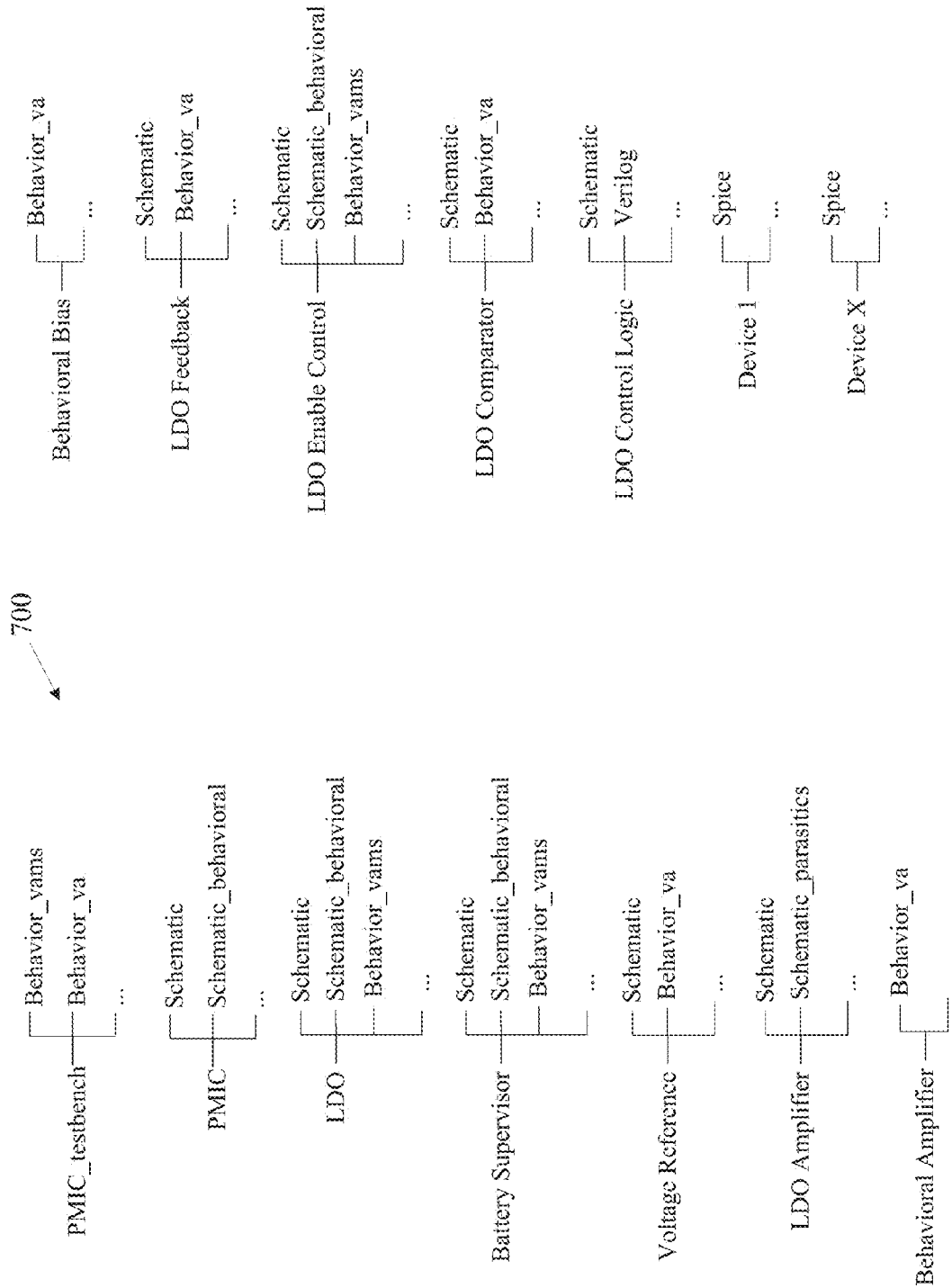
FIG. 7 depicts an instance parsed example test hierarchy.

FIG. 7 shows some of the different model views that may be chosen from for modeling a power management chip PMIC 700. The PMIC_testbench has Behavioral_vams and Behavioral_va levels having stimulus and oututs. The PMIC has Schematic and Schematic_behavioral levels. The LDO, LDO Enable Control and Battery Supervisor are defined at the Schematic, Schematic_behavioral and Behavioral_vams levels. The Voltage Reference, LDO Feedback and LDO Comparator are defined at the Schematic and Behavioral_va levels. The LDO Amplifier is defined at the Schematic and Schematic_parasitics levels. The Behavioral Amplifier and Behavioral Bias are defined at the Behavior_va level. The LDO Control Logic is defined at the Schematic and Verilog™ levels, and Devices 1 through X are defined at the Spice level.

Figure 8:
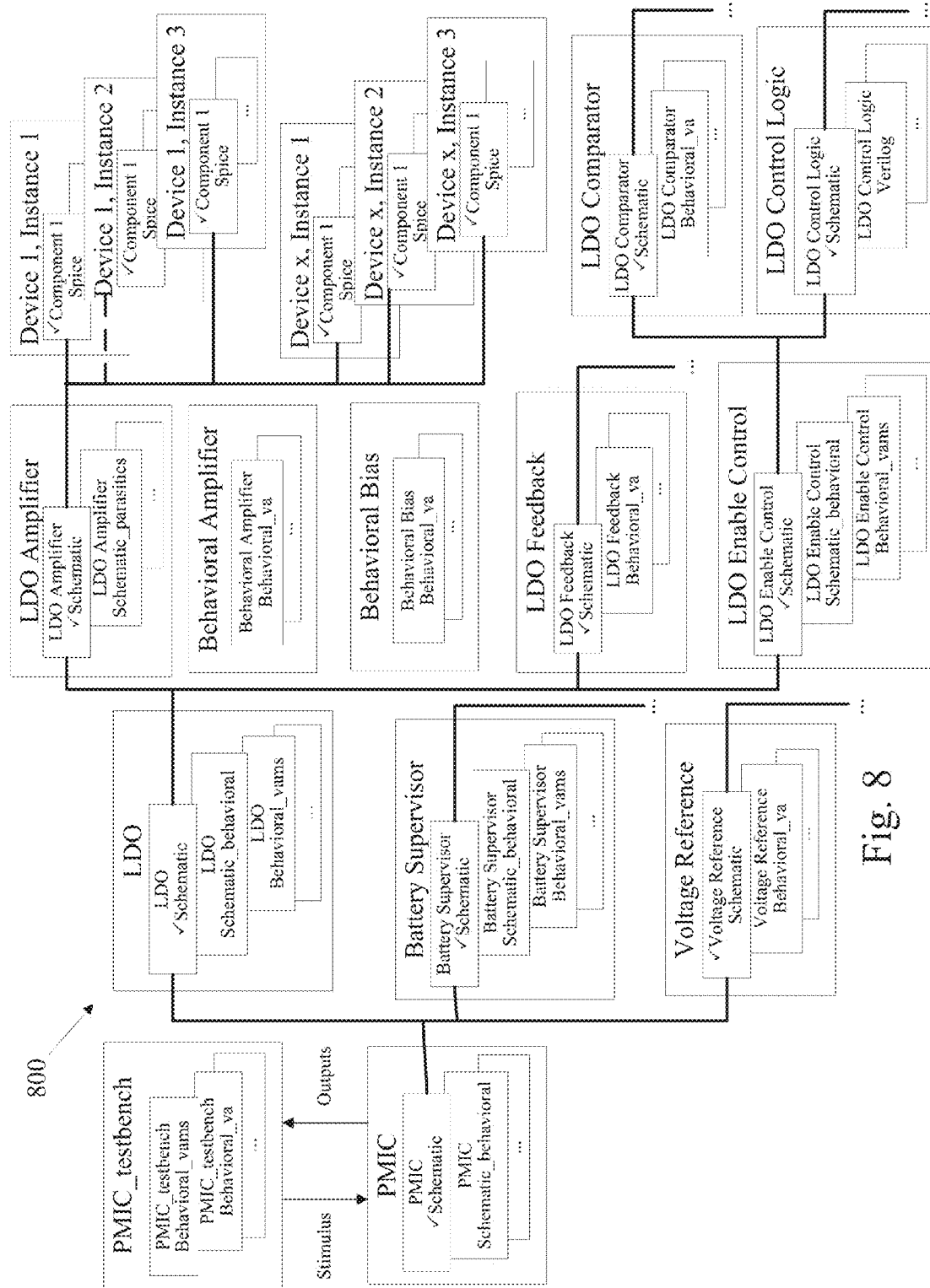
FIG. 8 depicts a first example test bench for a power management integrated circuit.

FIG. 8 shows a first test hierarchy of the power management chip PMIC described in FIG. 6 for a power management chip 800. The figure illustrates a portion of the hierarchy if a Spice primitive component configuration is defined. Device 1, Instance 2 is a dummy device in this model and would not change the simulator matrix.

Figure 9:
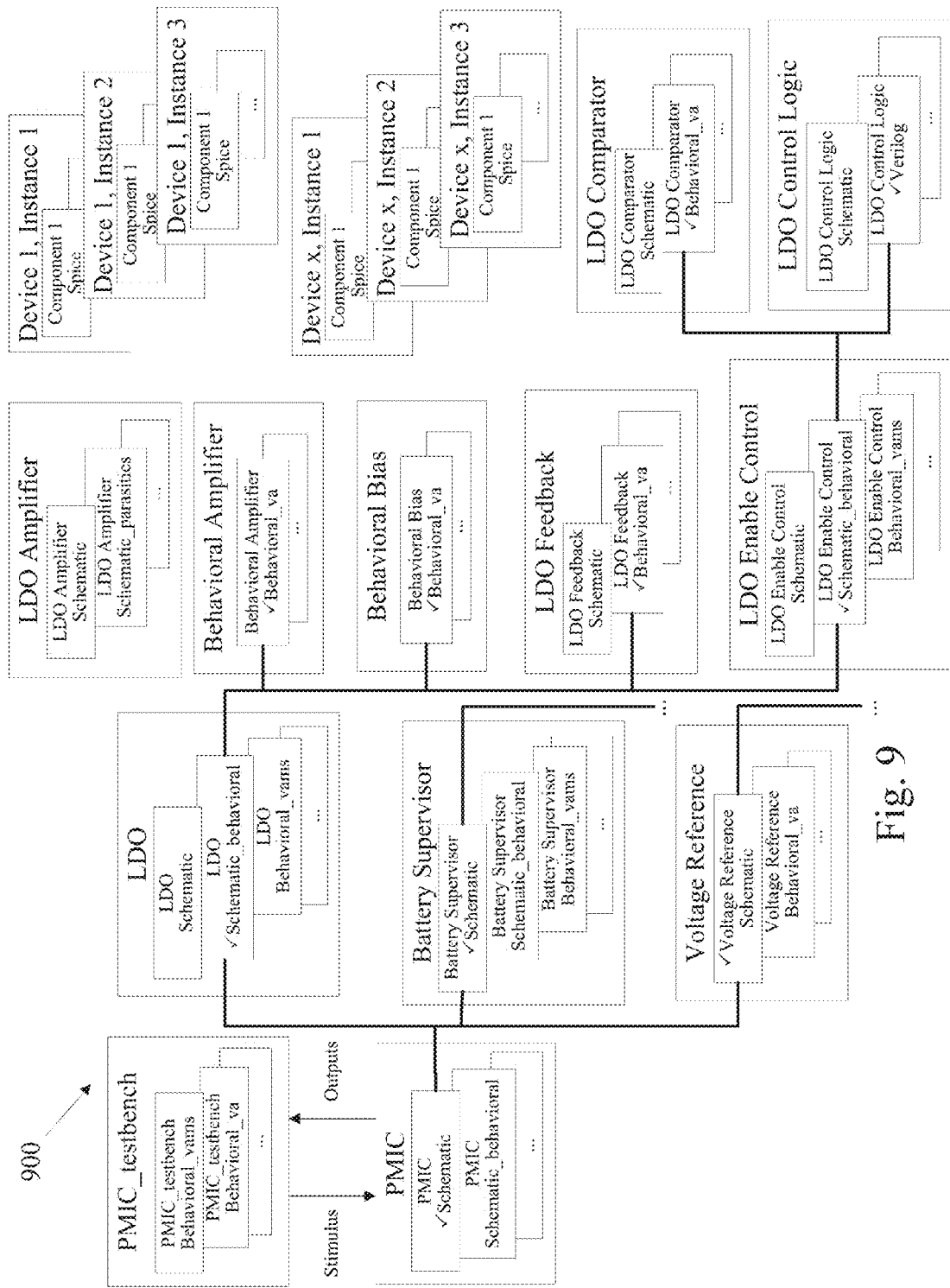
FIG. 9 depicts a second example test bench for a power management integrated circuit.

FIG. 9 shows a second test hierarchy of the power management chip PMIC described in FIG. 7 for a power management chip 900. The figure illustrates a portion of the hierarchy for one possible mixed configuration with some analog behavioral level models, some Verilog™ representations and some Spice primitive components.

Figure 10:
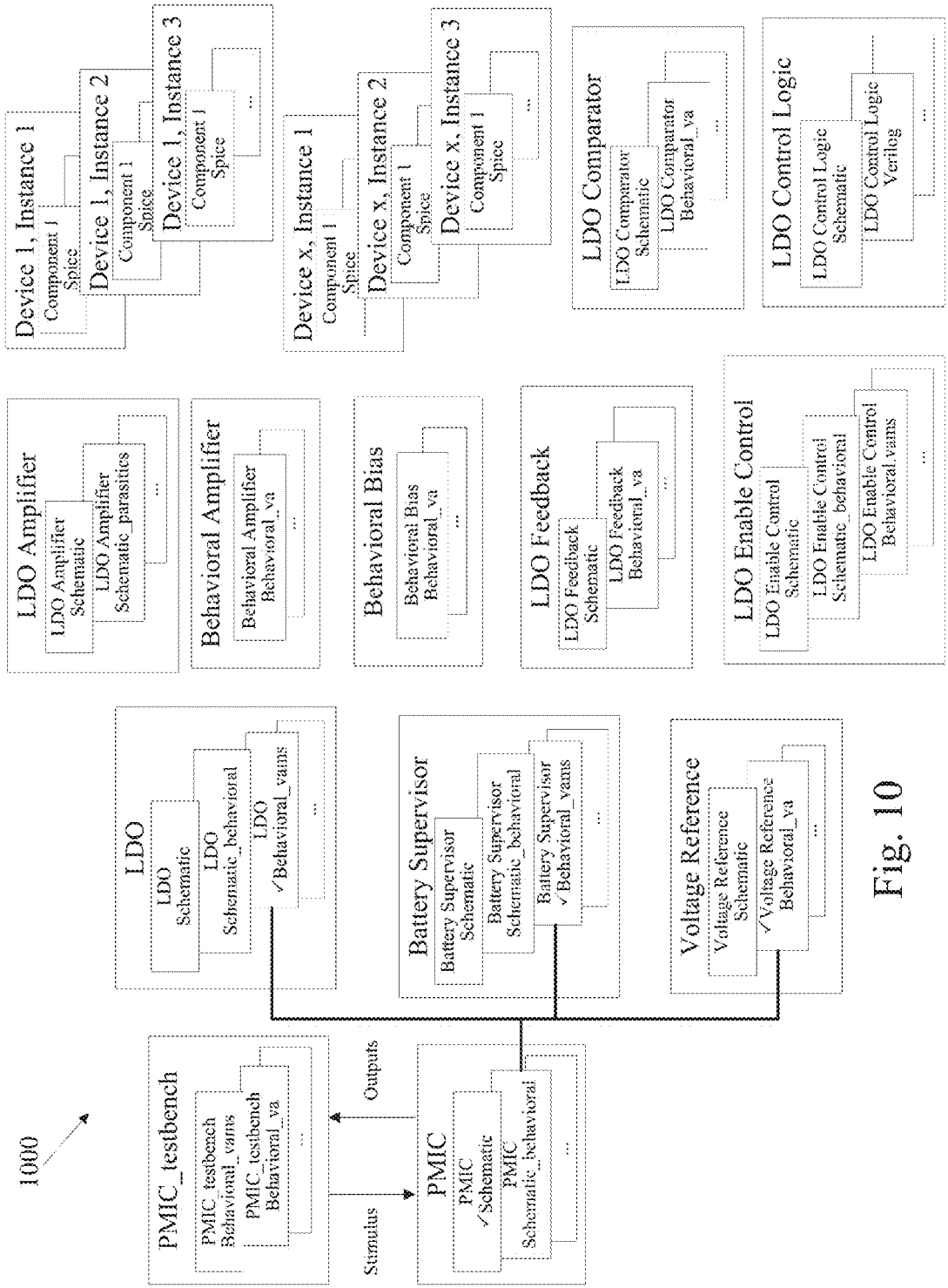
FIG. 10 depicts a third example test bench for a power management integrated circuit.

FIG. 10 shows a third test hierarchy of the power management chip PMIC described in FIG. 7 for a power management chip 1000. The figure illustrates a portion of the hierarchy if a behavioral configuration is defined.

Figure 11:
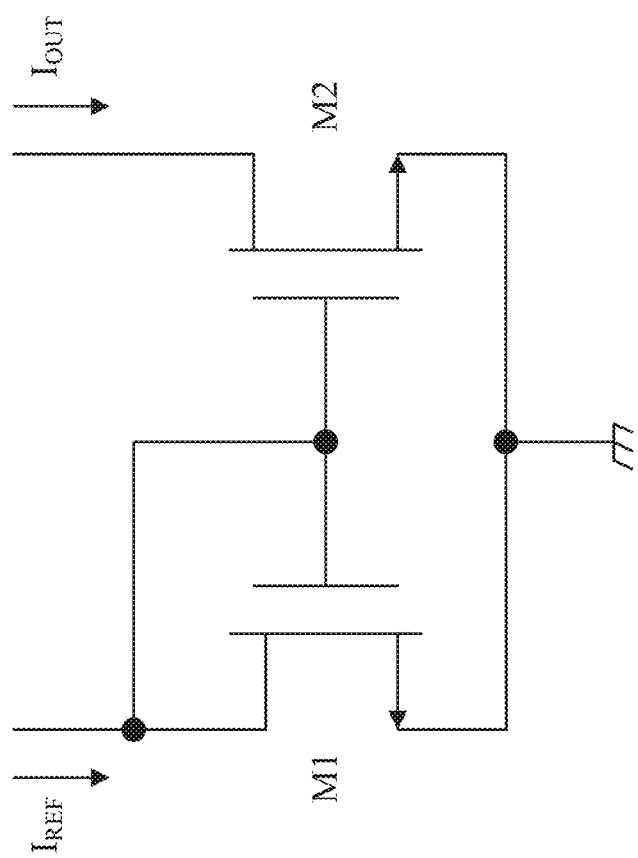
FIG. 11 depicts an example simple MOSFET current sink.
Figure 12:
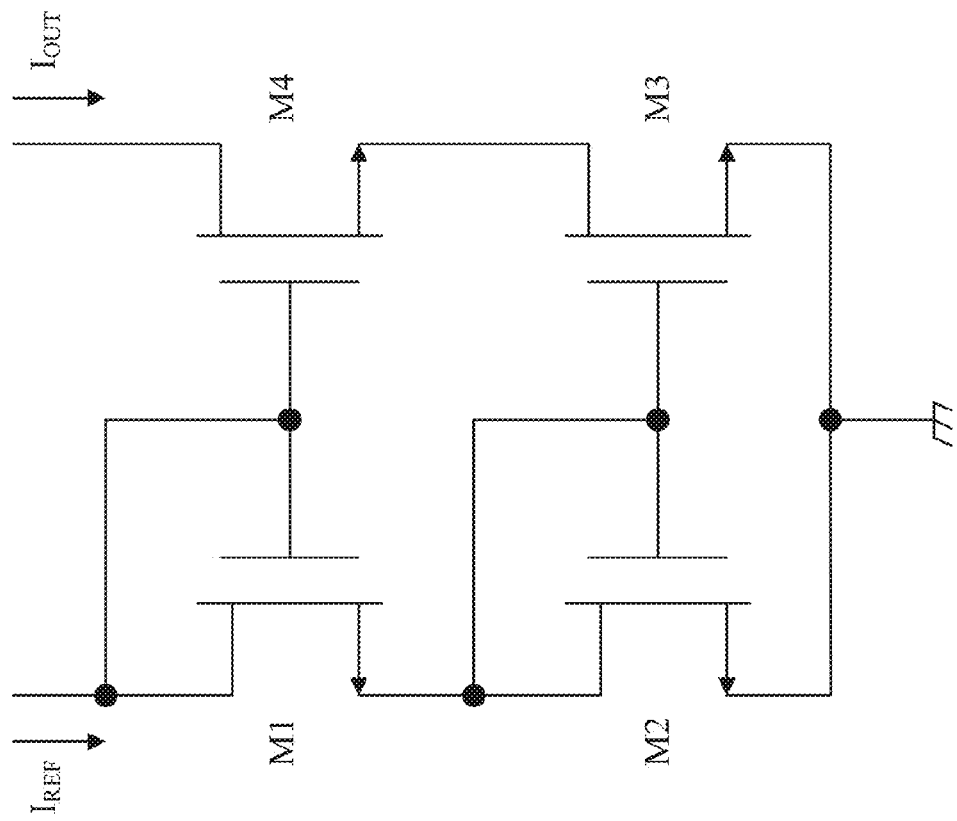
FIG. 12 depicts an example cascade MOSFET current sink.

Analog and mixed-signal circuits frequently have repeating topological patterns. FIGS. 11 and 12 are examples of common easily identifiable analog topologies. Current mirrors, also referred to as current sources and current sinks depending on the usage, are important tools in analog integrated circuit design to provide matched or ratioed currents throughout the circuit and therefore provide precision operation. FIG. 11 depicts an example simple current MOSFET current mirror. In this topology, the current I_OUT is approximately a fixed ratio of I_REF and independent of voltage if certain biasing conditions are satisfied.

FIG. 12 depicts an example cascode current sink. The cascode current mirror configuration creates higher output resistance and therefore offers some performance advantages compared to the simpler current source topology shown in FIG. 11. There are numerous other basic analog building block topologies in addition to these two example current mirrors. Other examples include but are not limited to differential input transistor pairs, standard gain stages, bandgap configurations.

Figure 13:
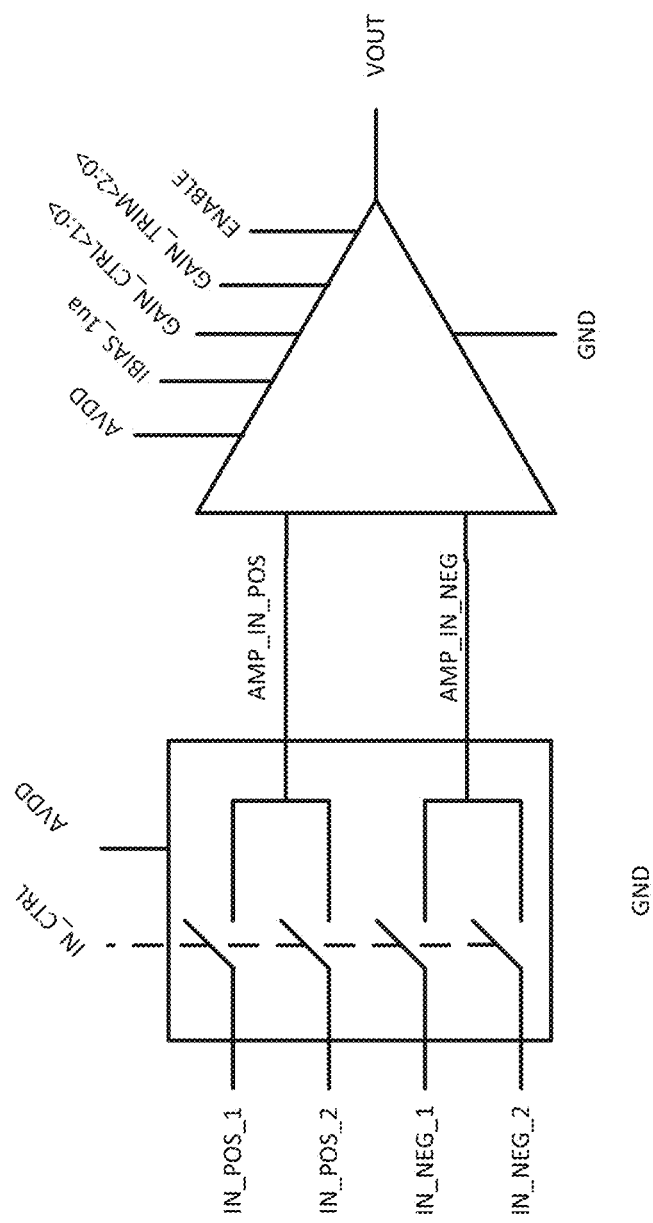
FIG. 13 depicts an example mux and opamp of an electronic design.

FIG. 13 depicts a simple example of an operational amplifier with some typical features of an amplifier included within a larger system-on-a-chip (SOC). Even this simple example can demonstrate the increasing complexity of today's verification challenges for mixed-signal designs. Feeding the inputs to the amplifier is a simple multiplexer (mux). The control signal IN_CTRL to the mux will serve as a digital input signal to a series of logic gates within the mux block. These gates will then control the switches to select between two pairs of analog inputs: pair one (IN_POS_1 and IN_NEG_1) and pair 2 (IN_POS_2 and IN_NEG_2). For instance, a value of IN_CTRL equal to logic level "0" could close the switches connected to IN_POS_1 and IN_NEG_1 while an IN_CTRL value of logic level "1" could close the switches connected to IN_POS_2 and IN_NEG_2. The analog inputs selected are then output from the mux. These signals are now connected to the amplifier inputs. The mux block also has connections for the power supplies. In this case because analog signals will pass through the block, the power supply connections are to the analog supply voltages AVDD and GND.

For the amplifier block, the power supply connection is also to the analog supply voltage AVDD and GND. Note that it is not unusual on complex SOC's to have multiple internal power supplies. Even for the analog blocks there may be options such as different power supply levels. In other cases, the same voltage level may be supplied, but one supply source may be used for critical blocks that may be susceptible to any noise on the supply line. Other blocks that are noisier (typically due to functions such as high frequency switching), may be connected to a different supply source that is the same voltage level. For this reason, digital blocks are almost always powered separately from analog blocks. In addition, with the increasing importance of reducing power, some power supplies may be turned off during various operating modes. As a result, design engineers may also need to verify that a given block is connected to a supply that will be available at the appropriate times.

Another common configuration within a larger chip is to have a common block that provides many of the biasing currents required by analog functions. In this example, the amplifier has an input for a 1 uA bias current. Other common options include signals for trim and control or programmability. In this example, the amplifier has 2 control bits, GAIN_CTRL<1:0>, that can set a gain value and 3 bits, GAIN_TRIM<2:0>, that would slightly tune the gain value. Trim is typically performed when each device is tested and is used to compensate for manufacturing process variations and match the desired gain values to specified values as closely as possible. In this case GAIN_CTRL is a programmability feature to pick the best gain setting for a specific application. The ENABLE signal allows the amplifier to be powered on or off while the chip is operating. These types of controls are often provided to minimize power consumption, allow for clean power up sequences of the chip, and to provide protection during fault conditions.

For this simple example, there are numerous examples of verification requirements. These requirements can be separated into several categories:
  operating function—do the amplifier and mux meet their respective functional requirements
    does the mux correctly pass the selected input signals to the mux output
    does the amplifier meet it's expected behavior: gain, slew rate, input range, output range, etc.
  power supply and biasing
    is the block connected to the appropriate power supply and receiving the correct biasing
    is the supply and biasing available when expected and operating within the expected range
  control signals
    for every setting of control signals, is the correct behavior observed
  fault conditions
    when any of the block pins behaves in an manner outside allowed or expected ranges, does the block behave appropriately or is that condition either not possible (prevented elsewhere) or not expected to be handled Within the context of this disclosure, one benefit results from more efficiently managing the process of stepping through many combinations of possibilities. One of the best examples is just stepping through large numbers of digital control or trim options.

Consider this simple example within the context of a larger SOC and a top-level test bench for this SOC. This test bench may be one of many test benches for the chip, but this example can show how verification intellectual property developed for the amplifier can be leveraged even from a top-level test bench. The hierarchical concepts illustrated in FIG. 6 can be populated to show how an example test bench can be built. In this example A1 from FIG. 6 will represent the top-level test bench that includes the chip, all the necessary circuits or models to represent the system inputs, output loads, and external power supplies or other components for the chip, as well as portions of the tests configuration that can be described programmatically through software. This example hierarchy can be seen in the diagram in FIG. 6. As discussed previously, each item in the hierarchy can be represented by multiple types of views depending on the information available and the intended purpose of the block.

The second level of hierarchy in this example that correlates to level "B" in FIG. 6 will include all the elements placed in this top-level test bench. The first element will be the chip itself. In this example, the chip is identified as cell B1. B2 could be a cell that contains circuits or models to represent the system inputs to the chip. B3 could be a cell that contains circuits or models to represent the system provided power supplies and system output loads seen by the chip. B4 in this example will be a block written in software to connect either directly to pins of the chip or other blocks, provide values to any parameterized functions within any of the blocks, and/or monitor and measure specific performances during the simulation. In this simplified example, only signals that lead to the creation of the signals in the lower level example amplifier block are included.

This block B4 (or blocks) that can be captured in software will typically use high-level languages targeted at integrated circuit design (SystemVerilog, Verilog, Verilog-AMS, Verilog-A, SystemC, VHDL, etc.) but can also leverage more general languages and scripts such as C, C++, TCL, PERL, etc. The software portions may create stimulus, define design values for parameters in existing circuit or system blocks, or measure and monitor performance throughout the simulation. For example, the Universal Verification Methodology (UVM) for SystemVerilog includes common constructs for defining monitoring and scoreboard functions as well as defining stimulus. Digital verification methodology also includes numerous specific pieces of verification intellectual property (VIP) that are targeted to specific functions or protocols. For instanced defined communication standards such as Universal Serial Bus (USB), Serial Peripheral Interface (SPI) bus, etc. will have specific verification IP that can be leveraged during the verification process both to supply data through the interface and also test and validate that the interface is matching the protocol standards. In this example, the digital trim and controls will be assumed programmed through a SPI interface or by the chip itself.

Figure 14:
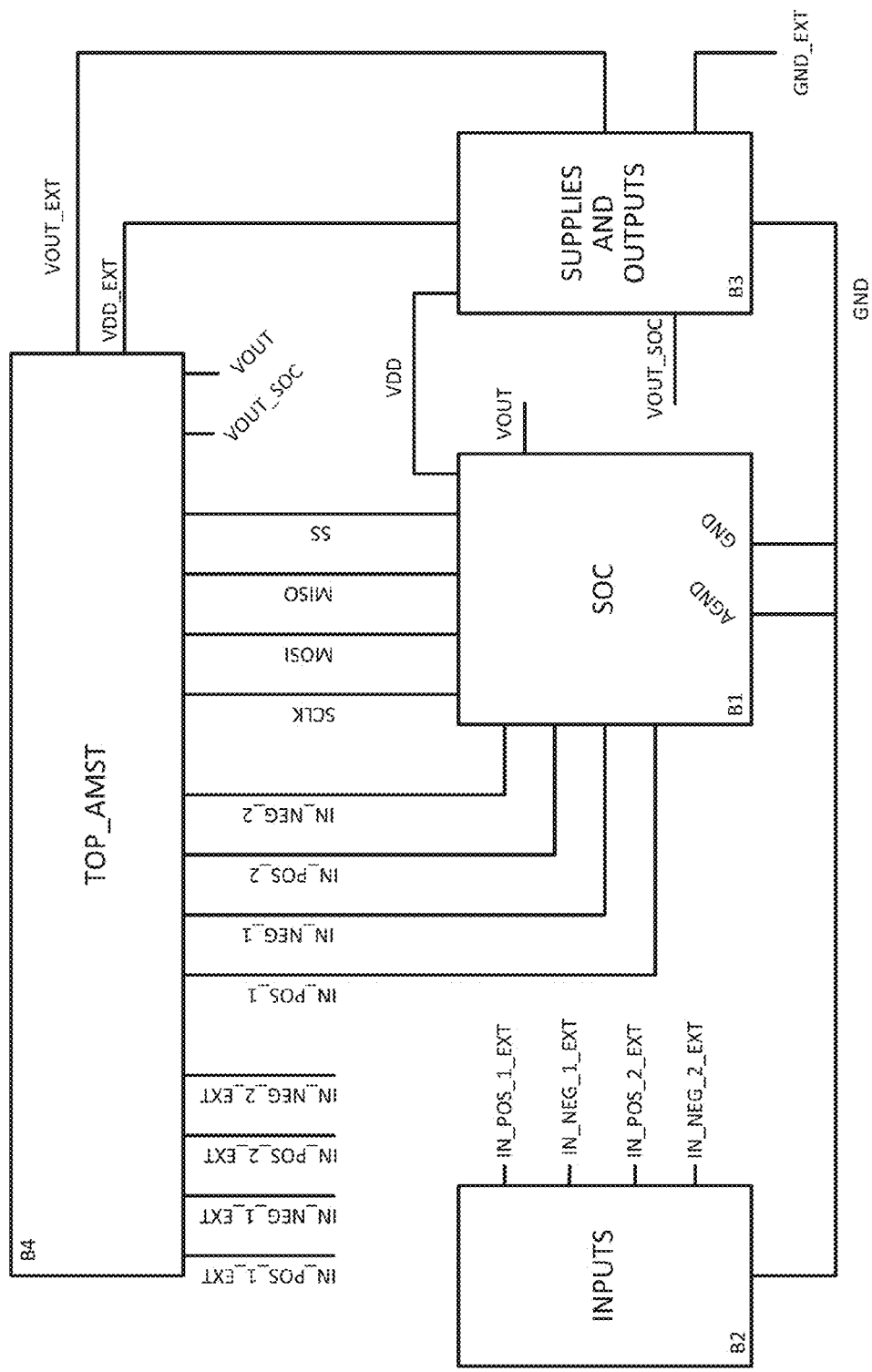
FIG. 14 depicts a B level example of an electronic design.

FIG. 14 depicts a simplified example testbench for a SOC. In this example, the SOC hierarchy contains the amplifier and mux shown in FIG. 13. This example shows how some signals may pass from the top level of the design through the hierarchy to a lower level subsystem. In this testbench, the external power supply VDD_EXT is being generated by Verilog-A code within the TOP_AMST. Then VDD_EXT is an input for the SUPPLIES_AND_OUTPUTS block. That block then outputs VDD which is connected to the SOC as the primary external power supply. For the inputs, the system inputs are generated within the INPUTS block and then passed through the TOP_AMST block before connecting to the SOC. Passing the inputs through the test harness allows both the voltage and current of the input signals to be monitored (or used as parameters for other calculations) throughout the simulation. Similarly VOUT from the SOC is passed through the TOP_AMST before entering the SUPPLIES_AND_OUTPUTS block. Finally, the VOUT_EXT is fed from the SUPPLIES_AND_OUTPUTS block to the TOP_AMST for monitoring. The decisions on which signals should be passed through the AMST test harness blocks are highly dependent on the system and the amount of circuits/models required around the chip to adequately represent the full system. Ultimately these decisions are driven by the system design and the verification plan.

Figure 15:
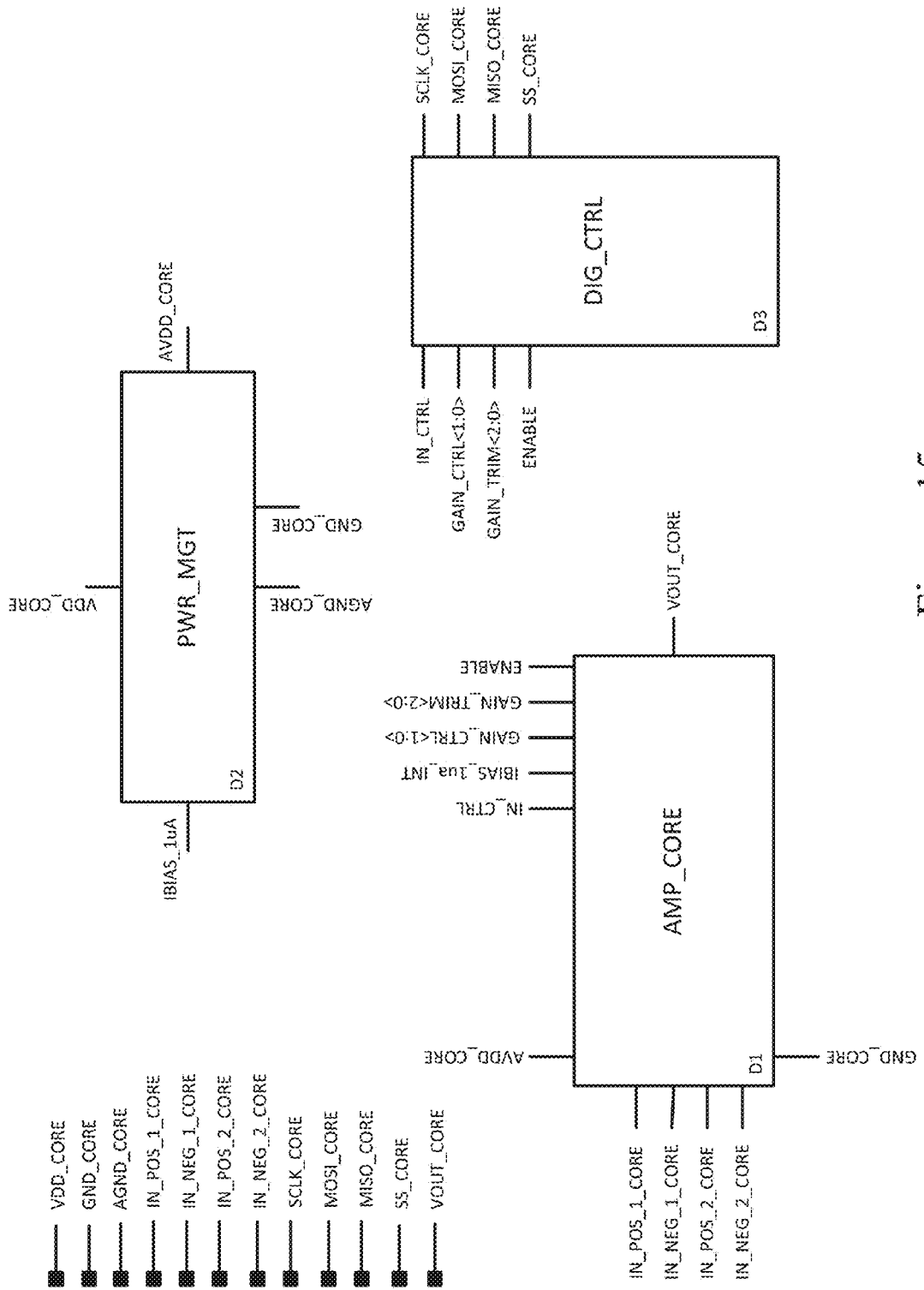
FIG. 15 depicts a D level example of an electronic design.

FIG. 15 depicts a D level example of an electronic design. Signals at lower levels of the hierarchy cannot be accessed unless those signals are brought to a pin at the top-level. Consider further the hierarchy of Instance B1 which represents the chip. In this example, the next level of the chip's hierarchy will contain C1, the SOC_CORE, and C2, the SOC_PAD_RING. Then push down into C1 to see D1, the AMP_CORE subsystem; D2, PWR_MGT (power management functions for the chip); and D3, DIG_CTRL (digital controls for the chip). The AMP_CORE subsystem contains the example amplifier and mux from FIG. 13.

Figure 16:
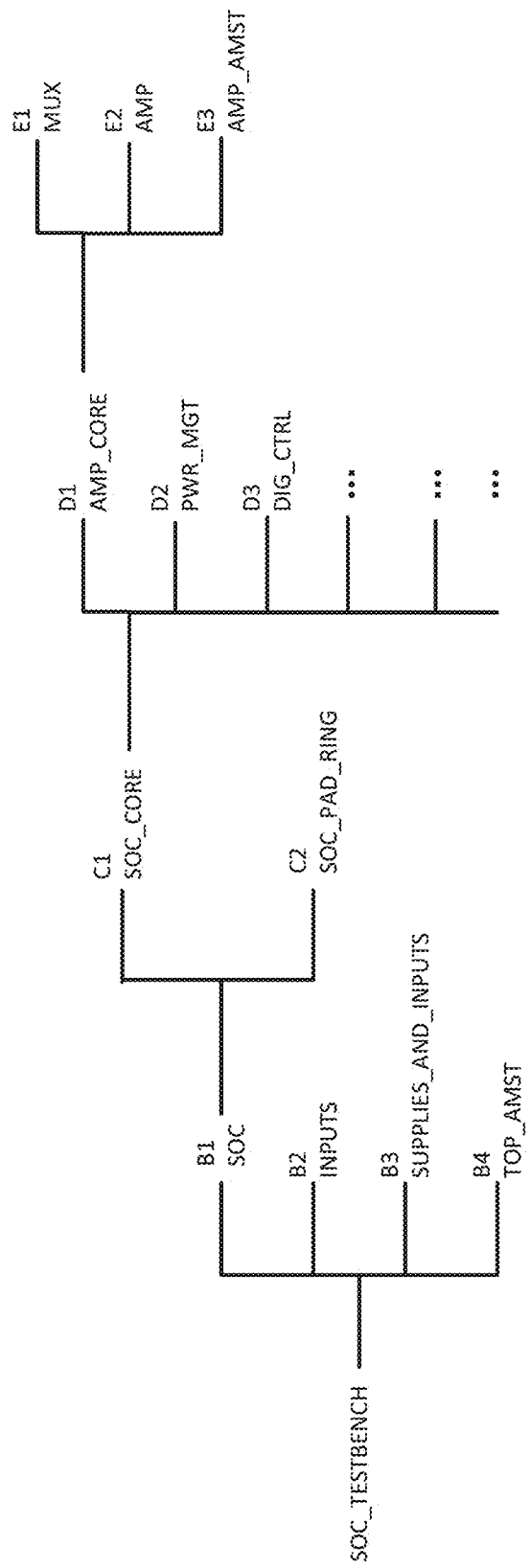
FIG. 16 depicts a hierarchical example of an electronic design.

FIG. 16 depicts a hierarchical example of an electronic design. At the SOC_TESTBENCH, there are four B level portions, B1 SOC (the chip being verified), B2 INPUTS, B3 SUPPLIES_AND INPUTS and B4 TOP_AMST. At the C level are two portions, C1 SOC_CORE and C2 SOC_PAD_RING. The D level includes D1 AMP_CORE, D2 PWR_MGT and D3 DIG_CTRL and the E level includes E1 MUX, E2 AMP and E3 AMP_AMST. Throughout this example hierarchy, instrumentation points could be added.

FIG. 17 depicts an E level example of an electronic design. Further descending into the AMP_CORE subsystem shows the subsystem elements: E1, the MUX; E2, the AMP; and E3, the AMP_AMST which is a VerilogAMS block containing verification IP for this subsystem. AMP_AMST provides a convenient point to add instrumentation for signals within the AMP_CORE hierarchy. Examples include capturing whether all of the amplifier control signals have been exercised and if the inputs to the amplifier are correct based on the inputs to the MUX and have been tested for all possible combinations of the MUX IN_CTRL. Other information such as whether the amplifier inputs (AMP_IN_POS, AMP_IN_NEG in FIG. 17) tested by signals supplied to the inputs at the top level of the SOC hierarchy (IN_POS_1, IN_NEG_1, IN_POS_2, IN_NEG_2 in FIG. 14), passed through the SOC_PAD_RING into AMP_CORE (IN_POS_1 CORE, IN_NEG_1 CORE, IN_POS_2 CORE, and IN_NEG_2 CORE in FIG. 15) and passed through the MUX and selected by IN_CTRL fully exercise the input dynamic range of the amplifier. Note that a verification monitor at the top level of the hierarchy cannot connect directly to the amplifier inputs, AMP_IN_POS and AMP_IN_NEG. In this manner, the instrumentation points in combination with criteria defined within the AMST, provide a direct measure of verification coverage of the amplifier. This data can be calculated cumulatively over numerous individual simulations and different input conditions.

Figure 18:
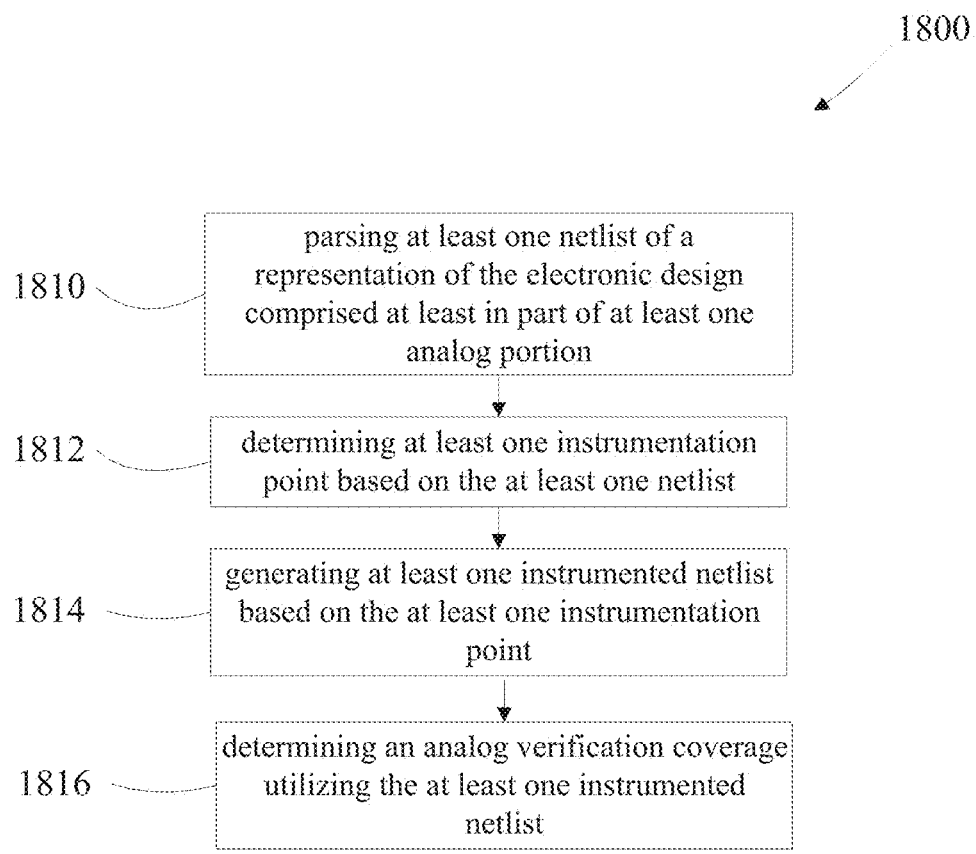
FIG. 18 depicts a first example of a computer implemented method of identification of useful untested states of an electronic design.

In the first example which is netlist initiated, FIG. 18, has as its starting point a pre-existing netlist of an analog or mixed signal design. This flow chart illustrates a computer program product for identification of useful untested states of an electronic design 1800. The method comprises parsing 1810 at least one netlist of a representation of the electronic design comprised at least in part of at least one analog portion, determining 1812 at least one instrumentation point based on the at least one netlist, generating 1814 at least one instrumented netlist based on the at least one instrumentation point and determining 1816 an analog verification coverage utilizing the at least one instrumented netlist. The electronic design may be analog or mixed signal. It is also envisioned that this electronic design may be extended to the verification of electromechanical, electrochemical and electrobiological systems.

Figure 19:
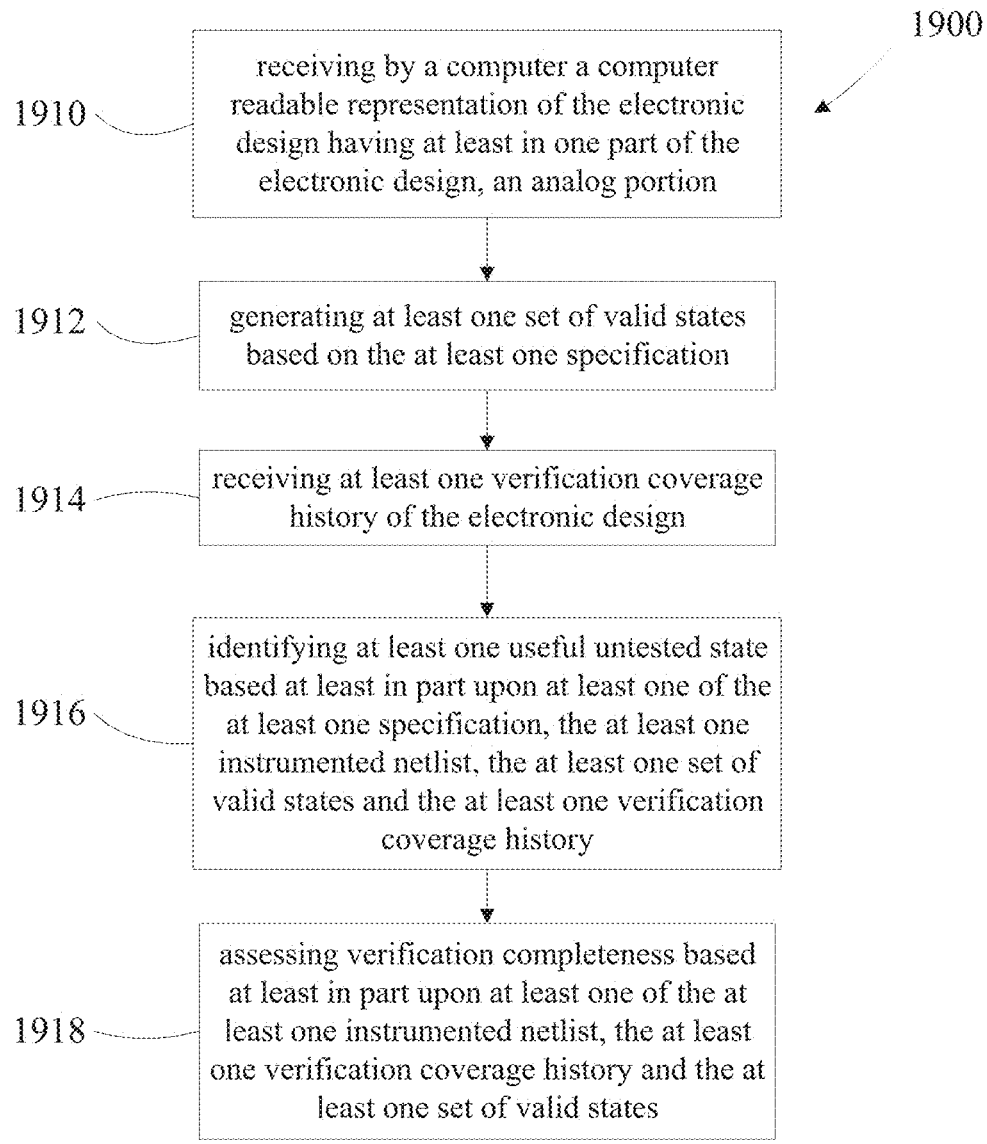
FIG. 19 depicts additional steps that the first example of identification of useful untested states of an electronic design may additionally comprise.

FIG. 19 depicts additional steps that would begin before step one 1812 of the first example of instrumentation 1900 of an electronic design. In this case the electronic design is the initiation point, from which the netlist is created and additionally, the specification and the verification history are part of the initial dataset. The example may additionally comprise receiving 1910 by a computer a computer readable representation of the electronic design having at least in one part of the electronic design, an analog portion and generating 1912 at least one set of valid states based on the at least one specification. The first example may also comprise receiving 1914 at least one verification coverage history of the electronic design, it is envisioned that the coverage history may be for related circuits, circuits sharing common characteristics and the like. The method may also comprise identifying 1916 at least one useful untested state based at least in part upon at least one of the at least one specification, the at least one instrumented netlist, the at least one set of valid states and the at least one verification coverage history and assessing 1918 verification completeness based at least in part upon at least one of the at least one instrumented netlist, the at least one verification coverage history and the at least one set of valid states. The at least one untested state are valid states that have not yet been tested. Referring back to FIG. 6, the electronic design would encompass each connected block in the figure. The top level hierarchy is A1, the next level of hierarchy is B, which includes B1 and B2 and underneath the B hierarchy is the C hierarchy having C1, C2 and C3. In this specific example at the B1 level and below the model is comprised of Schematic and Spice models. At the B2 level the model encompasses Schematic_behavioral and Behavioral_va models. In this instance the analog test model would be connected to A1, instance 1 level and would be connected through the netlist, connecting lines to each of the components under test.

Figure 20:
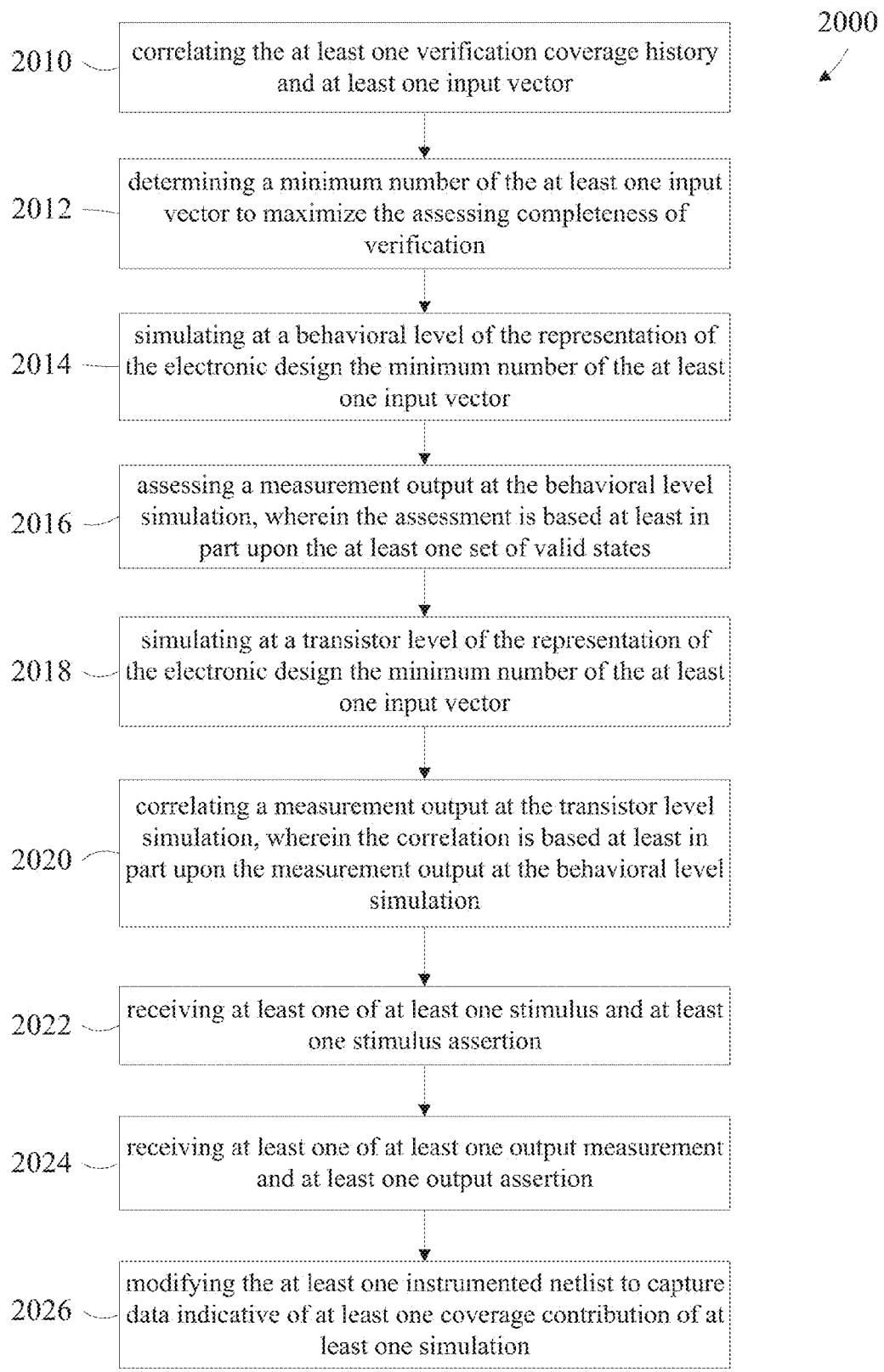
FIG. 20 depicts additional steps that the first example of identification of useful untested states of an electronic design may additionally comprise.

FIG. 20 depicts additional steps that are in addition to the steps in the FIG. 19 example of instrumentation 2000 of an electronic design, it is envisioned that the steps would fall between step 1914 and 1916, but may occur at other points in the flow. These additional steps may comprise correlating 2010 the at least one verification coverage history and at least one input vector and determining 2012 a minimum number of the at least one input vector to maximize the assessed completeness of verification. The correlation may comprise a measure of sameness, overlap, or the like of input characteristics and assertions. The method may further comprise simulating 2014 at a behavioral level of the representation of the electronic design the minimum number of the at least one input vector and assessing 2016 a measurement output at the behavioral level simulation, wherein the assessment is based at least in part upon the at least one set of valid states. The method may further comprise the steps of simulating 2018 at a transistor level of the representation of the electronic design the minimum number of the at least one input vector and correlating 2020 a measurement output at the transistor level simulation, wherein the correlation is based at least in part upon the measurement output at the behavioral level simulation. The method may also comprise receiving 2022 at least one of at least one stimulus and at least one stimulus assertion, receiving 2024 at least one of at least one output measurement and at least one output assertion and modifying 2026 the at least one instrumented netlist to capture data indicative of at least one coverage contribution of at least one simulation. Behavioral level simulations may precede transistor level and/or behavioral level follow-on tests.

Figure 21:
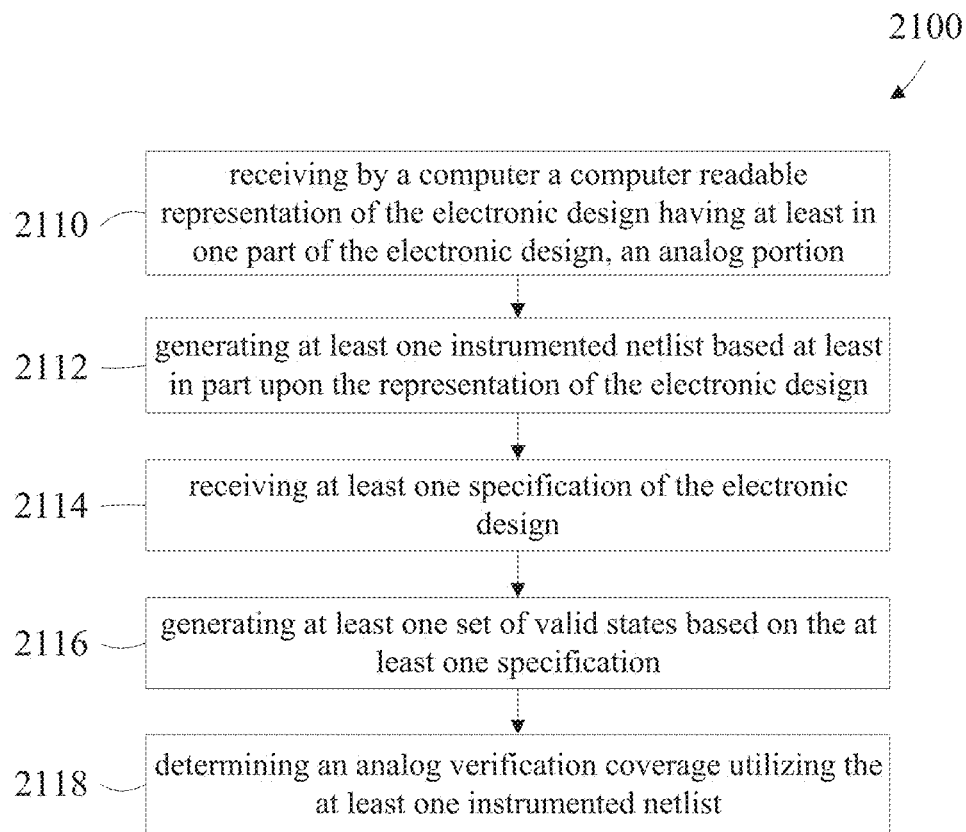
FIG. 21 depicts a second example of a computer implemented method of identification of useful untested states of an electronic design.

FIG. 21 depicts a second example which is electronic design initiated in that it begins with a representation of the analog or mixed signal electronic design. This electronic design initiated method comprises the steps of receiving 2110 by a computer a computer readable representation of the electronic design having at least in one part of the electronic design, an analog portion, generating 2112 at least one instrumented netlist based at least in part upon the representation of the electronic design, receiving 2114 at least one specification of the electronic design, generating 2116 at least one set of valid states based on the at least one specification and determining 2118 an analog verification coverage utilizing the at least one instrumented netlist. The untested states are valid states that have not yet been tested. Returning back to FIG. 8, the electronic design would encompass each of the connected blocks following the PMIC_testbench, and at least one analog test harness model would pertain to the block marked PMIC_testbench. The netlist for that model would indicate each connection, connecting line in FIG. 8. The hierarchies associated with this design indicate that the LDO, Battery Supervisor and Voltage Reference blocks are lower in hierarchy than the PMIC block. Additionally, this model primarily reviews the schematic portion of the design.

Figure 22:
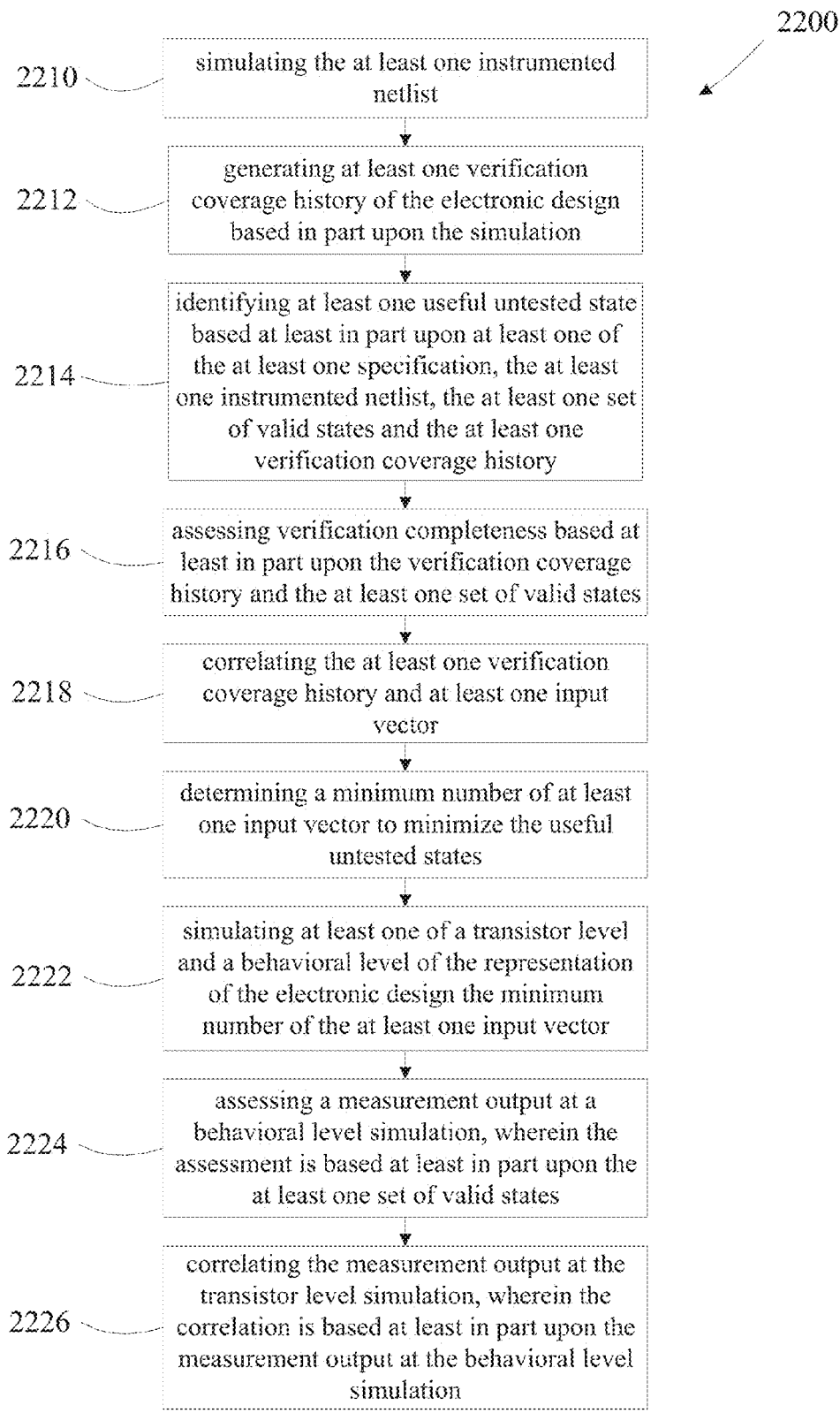
FIG. 22 depicts additional steps that the second example of identification of useful untested states of an electronic design may additionally comprise.

FIG. 22 depicts additional steps of the electronic design initiated method, it is envisioned that the steps of FIG. 22 would fall after step 2112 of FIG. 21, however the order and placement of the steps may vary. The second example of instrumentation 2200 of an electronic design may additionally comprise steps such as simulating 2210 the at least one instrumented netlist, generating 2212 at least one verification coverage history of the electronic design based in part upon the simulation, and identifying 2214 at least one useful untested state based at least in part upon at least one of the at least one specification, the at least one instrumented netlist, the at least one set of valid states and the at least one verification coverage history. The method may further comprise assessing 2216 verification completeness based at least in part upon the verification coverage history and the at least one set of valid states, correlating 2218 the at least one verification coverage history and at least one input vector, wherein the simulation of the at least one instrumented netlist may be performed at a behavioral level and determining 2220 a minimum number of at least one input vector to minimize the useful untested states. The method may also comprise simulating 2222 at least one of a transistor level and a behavioral level of the representation of the electronic design the minimum number of the at least one input vector, assessing 2224 a measurement output at a behavioral level simulation, wherein the assessment is based at least in part upon the at least one set of valid states and correlating 2226 the measurement output at the transistor level simulation, wherein the correlation is based at least in part upon the measurement output at the behavioral level simulation.

Figure 23:
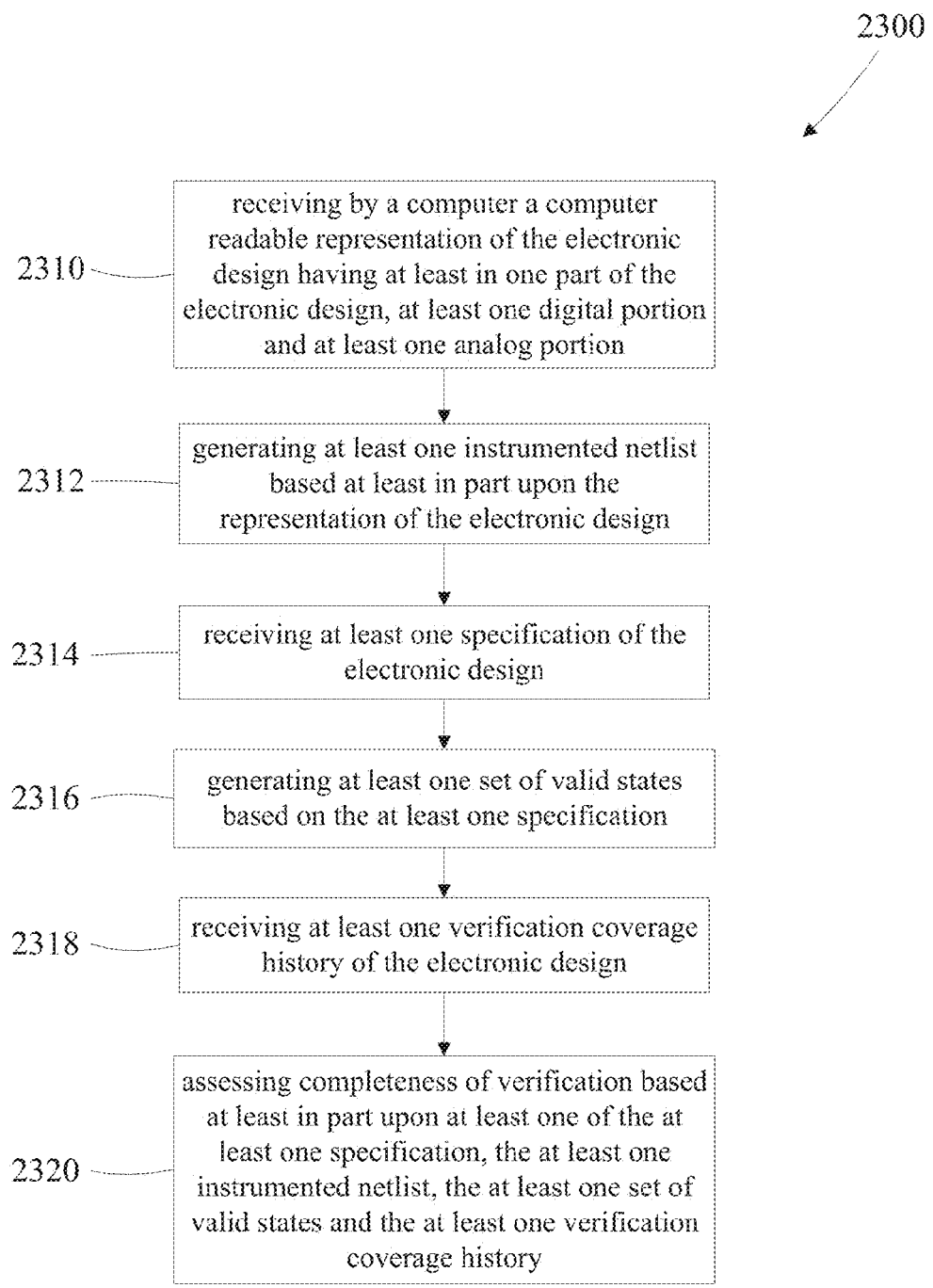
FIG. 23 depicts a third example of a computer implemented method of identification of useful untested states of an electronic design.

FIG. 23 depicts another electronic design initiated example of a computer implemented method of instrumentation of an analog or mixed signal electronic design 2300. This method also includes an assessment of the verification completeness utilizing the specification, instrumented netlist, a list of valid states and the previous verification coverage that has been performed on the design. The method comprises the steps of receiving 2310 by a computer a computer readable representation of the electronic design having at least in one part of the electronic design, at least one digital portion and at least one analog portion, generating 2312 at least one instrumented netlist based at least in part upon the representation of the electronic design and receiving 2314 at least one specification of the electronic design. The method also comprises generating 2316 at least one set of valid states based on the at least one specification, receiving 2318 at least one verification coverage history of the electronic design and assessing 2320 completeness of verification based at least in part upon at least one of the at least one specification, the at least one instrumented netlist, the at least one set of valid states and the at least one verification coverage history. Referring back to FIG. 9, the electronic design would encompass each of the connected blocks following the PMIC_testbench, and at least one analog test harness model would pertain to the block marked PMIC_testbench. The netlist would indicate the connectivity, shown by the lines connecting each of the blocks. The hierarchies associated with this design indicate that the LDO, Battery Supervisor and Voltage Reference blocks are lower in hierarchy than the PMIC block. This model reviews the schematic, schematic behavioral and behavioral.va aspects of the model. Though the overall electronic design is the same as in FIG. 8, what is tested, the hierarchies and connectivity are different.

Figure 24:
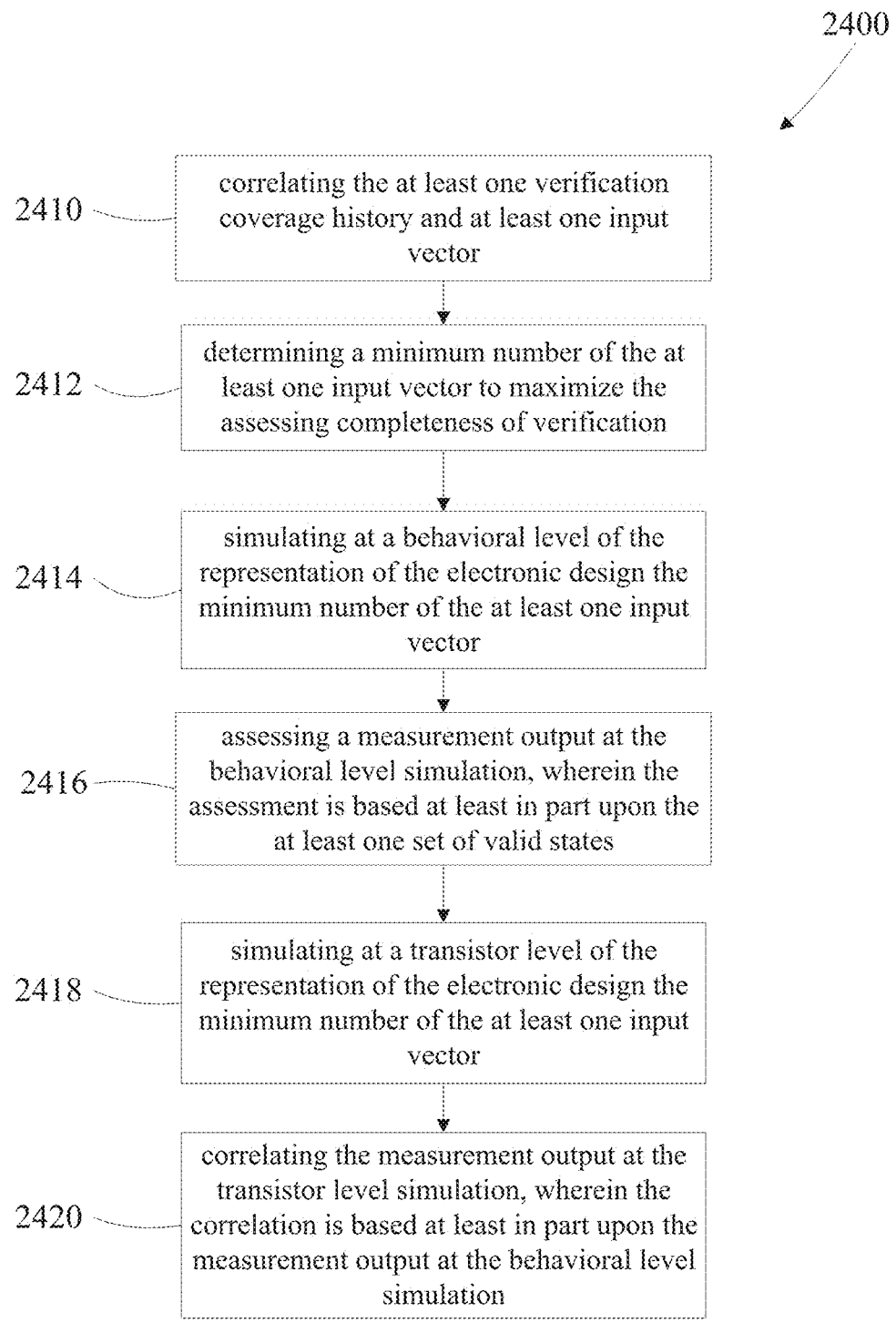
FIG. 24 depicts additional steps that the third example of identification of useful untested states of an electronic design may additionally comprise.

FIG. 24 depicts additional steps that may occur after step 2318 of FIG. 23, although the exact point of inclusion may alter depending upon the specific implementation. The third example of instrumentation 2400 of an electronic design may additionally comprise such as correlating 2410 the at least one verification coverage history and at least one input vector, determining 2412 a minimum number of the at least one input vector to maximize the assessing completeness of verification and simulating 2414 at a behavioral level of the representation of the electronic design the minimum number of the at least one input vector. The method may also comprise assessing 2416 a measurement output at the behavioral level simulation, wherein the assessment is based at least in part upon the at least one set of valid states, simulating 2418 at a transistor level of the representation of the electronic design the minimum number of the at least one input vector and correlating 2420 the measurement output at the transistor level simulation, wherein the correlation is based at least in part upon the measurement output at the behavioral level simulation.

Figure 25:
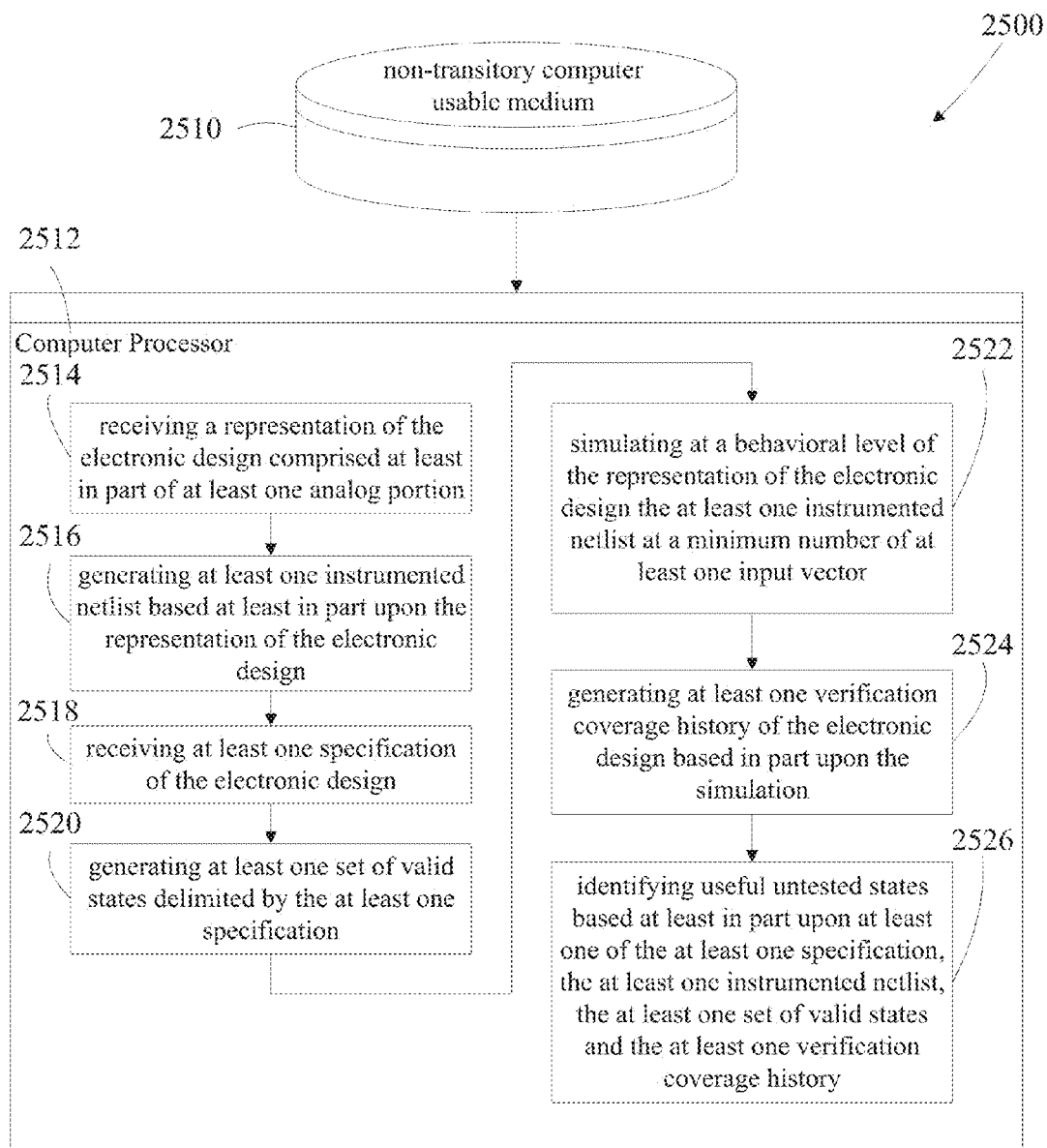
FIG. 25 depicts a fourth example of a computer implemented method of identification of useful untested states of an electronic design.

In a fourth example, FIG. 25 illustrates an electronic design initiated behavioral model. The computer program product 2500 is embodied on a non-transitory computer usable medium 2510. The non-transitory computer usable medium having stored thereon a sequence of instructions which, when executed by at least one processor 2512 causes the at least one processor to execute a method of identification of useful untested states of an electronic design, comprising the steps of receiving 2514 a representation of the electronic design comprised at least in part of at least one analog portion and generating 2516 at least one instrumented netlist based at least in part upon the representation of the electronic design. The computer program product further comprises the steps of receiving 2518 at least one specification of the electronic design, generating 2520 at least one set of valid states based on the at least one specification and simulating 2522 at a behavioral level of the representation of the electronic design the at least one instrumented netlist at a minimum number of the at least one input vector. The computer program product further comprises the steps of generating 2524 at least one verification coverage history of the electronic design based in part upon the simulation and identifying 2526 useful untested states based at least in part upon at least one of the at least one specification, the at least one instrumented netlist, the at least one set of valid states and the at least one verification coverage history. Referring back to FIG. 10, the electronic design would encompass each of the connected blocks following the PMIC_testbench, and at least one analog test harness model would pertain to the block marked PMIC_testbench. In this example the PMIC hierarchy and the LDO, Battery Supervisor and Voltage Reference hierarchies are reviewed. At the highest level the PMIC is reviewed at the schematic level and the LDO at the Behavioral_vams, the Battery Supervisor at the Behavioral_vams and the Voltage reference at the Behavioral_va level.

Figure 26:
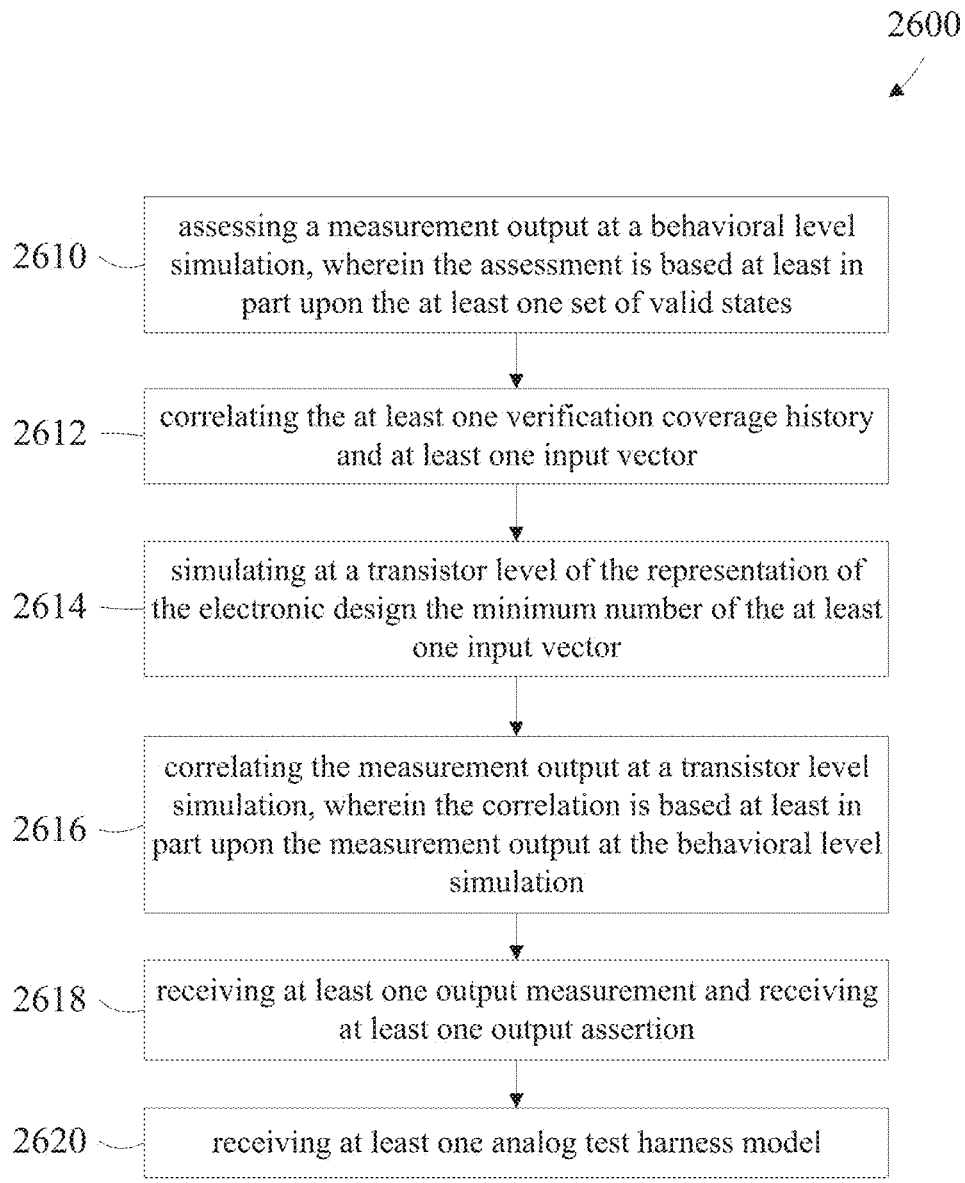
FIG. 26 depicts additional steps that the fourth example of instrumentation of identification of useful untested states of an electronic design.

FIG. 26 depicts additional steps beginning at some point after step 2516 of FIG. 25. The steps may additionally comprise assessing 2610 a measurement output at a behavioral level simulation, wherein the assessment is based at least in part upon the at least one set of valid states, correlating 2612 the at least one verification coverage history and at least one input vector and simulating 2614 at a transistor level of the representation of the electronic design the minimum number of the at least one input vector. The example may also comprise correlating 2616 the measurement output at a transistor level simulation, wherein the correlation is based at least in part upon the measurement output at the behavioral level simulation, receiving 2618 at least one output measurement and receiving at least one output assertion and receiving 2620 at least one analog test harness model.

Figure 27:
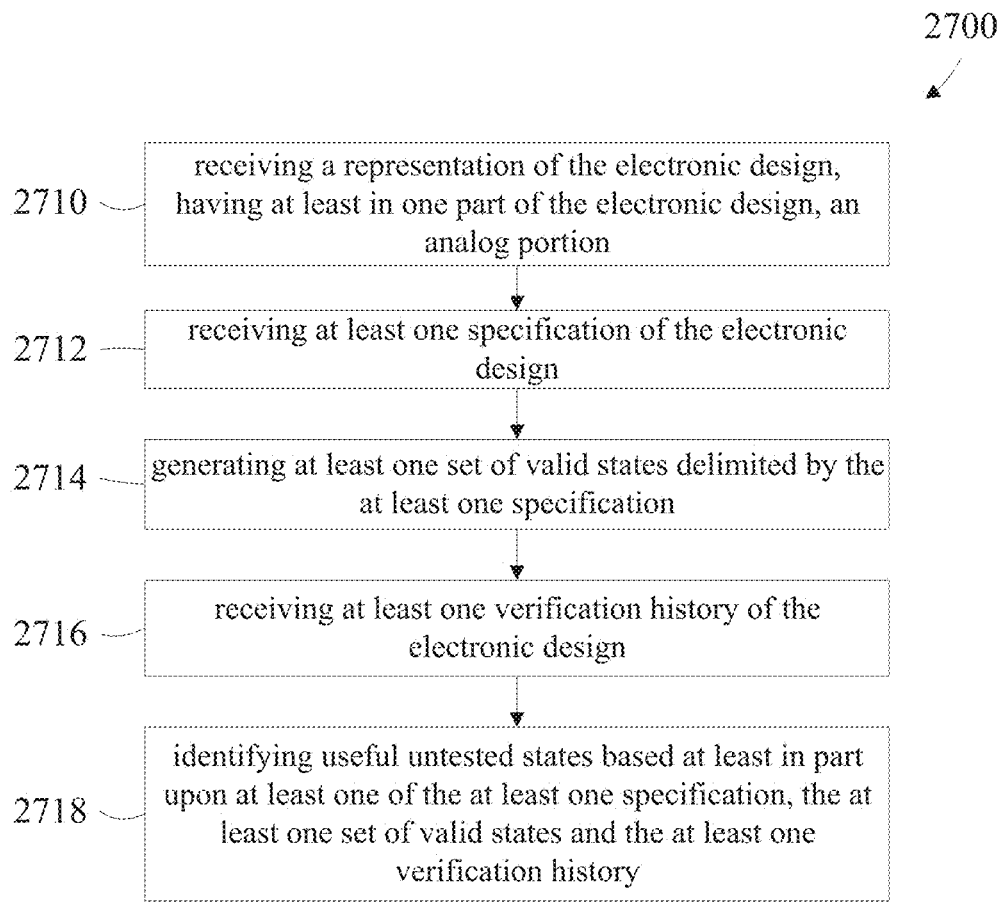
FIG. 27 depicts a fifth example of a computer program product embodied on a non-transitory computer usable medium to identify of useful untested states of an electronic design.

FIG. 27 depicts a post-simulation aggregated analysis as a fifth example of a computer implemented method of instrumentation of an electronic design 2700. In this case the simulations have been run and a database of information collected which allows a review looking for holes in the verification coverage. The analysis method comprises the steps of receiving 2710 a representation of the electronic design, having at least in one part of the electronic design, an analog portion, receiving 2712 at least one specification of the electronic design, generating 2714 at least one set of valid states delimited by the at least one specification, receiving 2016 at least one verification history of the electronic design and identifying 2718 useful untested states based at least in part upon at least one of the at least one specification, the at least one set of valid states and the at least one verification history. Referring back to FIG. 8, the electronic design would encompass each of the connected blocks following the PMIC_testbench, and at least one analog test harness model would pertain to the block marked PMIC_testbench. The netlist for that model would indicate each connection, connecting line in FIG. 8. The hierarchies associated with this design indicate that the LDO, Battery Supervisor and Voltage Reference blocks are lower in hierarchy than the PMIC block. Additionally, this model primarily reviews the schematic portion of the design.

Figure 28:
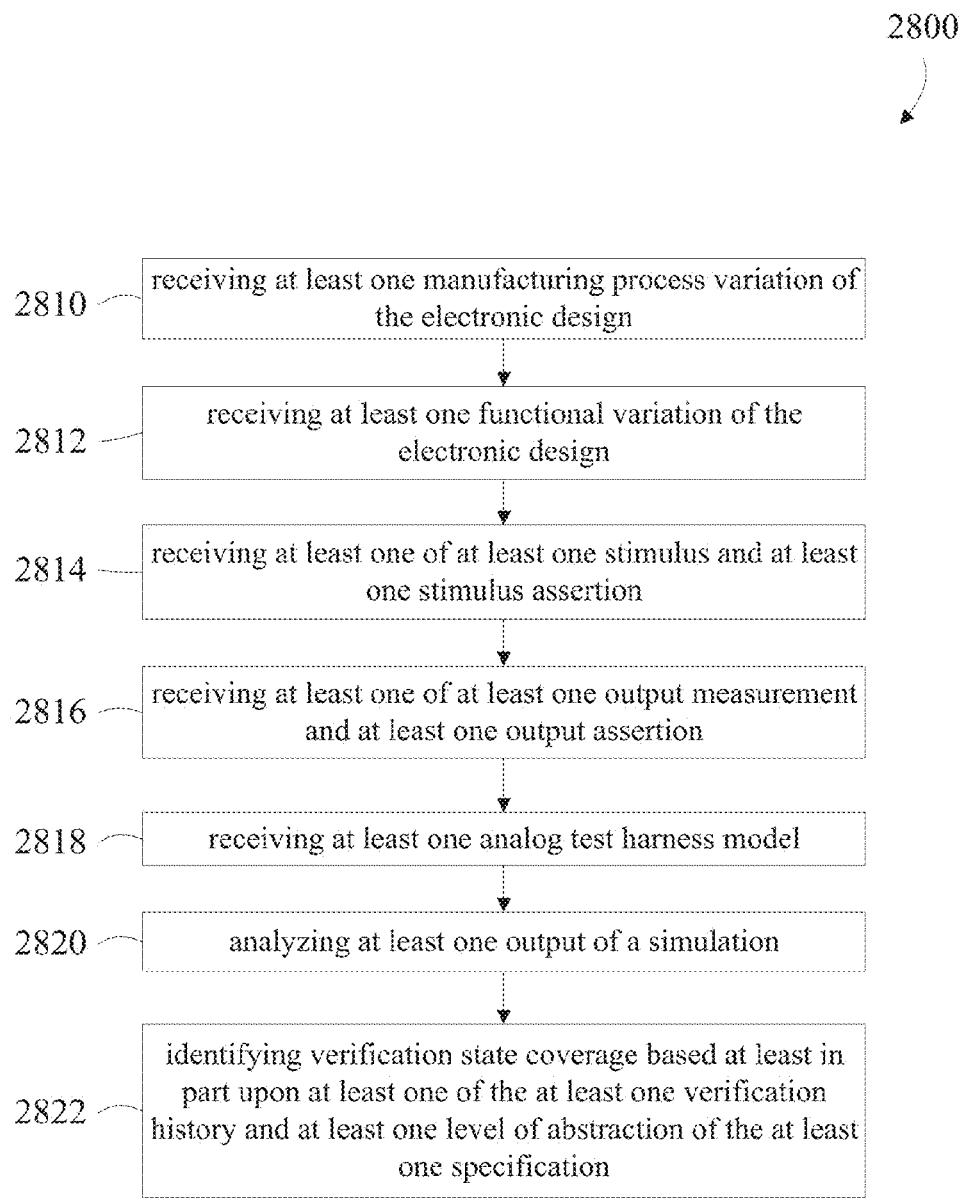
FIG. 28 depicts additional steps that the fifth example of a computer program product embodied on a non-transitory computer usable medium to identification of useful untested states of an electronic design may additionally comprise.

FIG. 28 depicts additional steps that may occur at any point after step 2710 of FIG. 27. In this example, the data inputs may vary and allow a broader review of the states that have been reviewed and what additional states need to be reviewed. This fifth example of instrumentation 2800 of an electronic design may additionally comprise steps such as receiving 2810 at least one manufacturing process variation of the electronic design, receiving 2812 at least one functional variation of the electronic design wherein the identifying useful untested states based at least in part upon the at least one manufacturing process variation and the at least one functional variation and receiving 2814 at least one of at least one stimulus and at least one stimulus assertion. The method may also comprise receiving 2816 at least one of at least one output measurement and at least one output assertion, receiving 2818 at least one analog test harness model, analyzing 2820 at least one output of a simulation and identifying 2822 verification state coverage based at least in part upon at least one of the at least one verification history and at least one level of abstraction of the at least one specification. Referring back to FIG. 9, the electronic design would encompass each of the connected blocks following the PMIC_testbench, and at least one analog test harness model would pertain to the block marked PMIC_testbench. The netlist would indicate the connectivity, shown by the lines connecting each of the blocks. The hierarchies associated with this design indicate that the LDO, Battery Supervisor and Voltage Reference blocks are lower in hierarchy than the PMIC block. This model reviews the schematic, schematic behavioral and behavioral.va aspects of the model. Though the overall electronic design is the same as in FIG. 8, what is tested, the hierarchies and connectivity are different.

Figure 29:
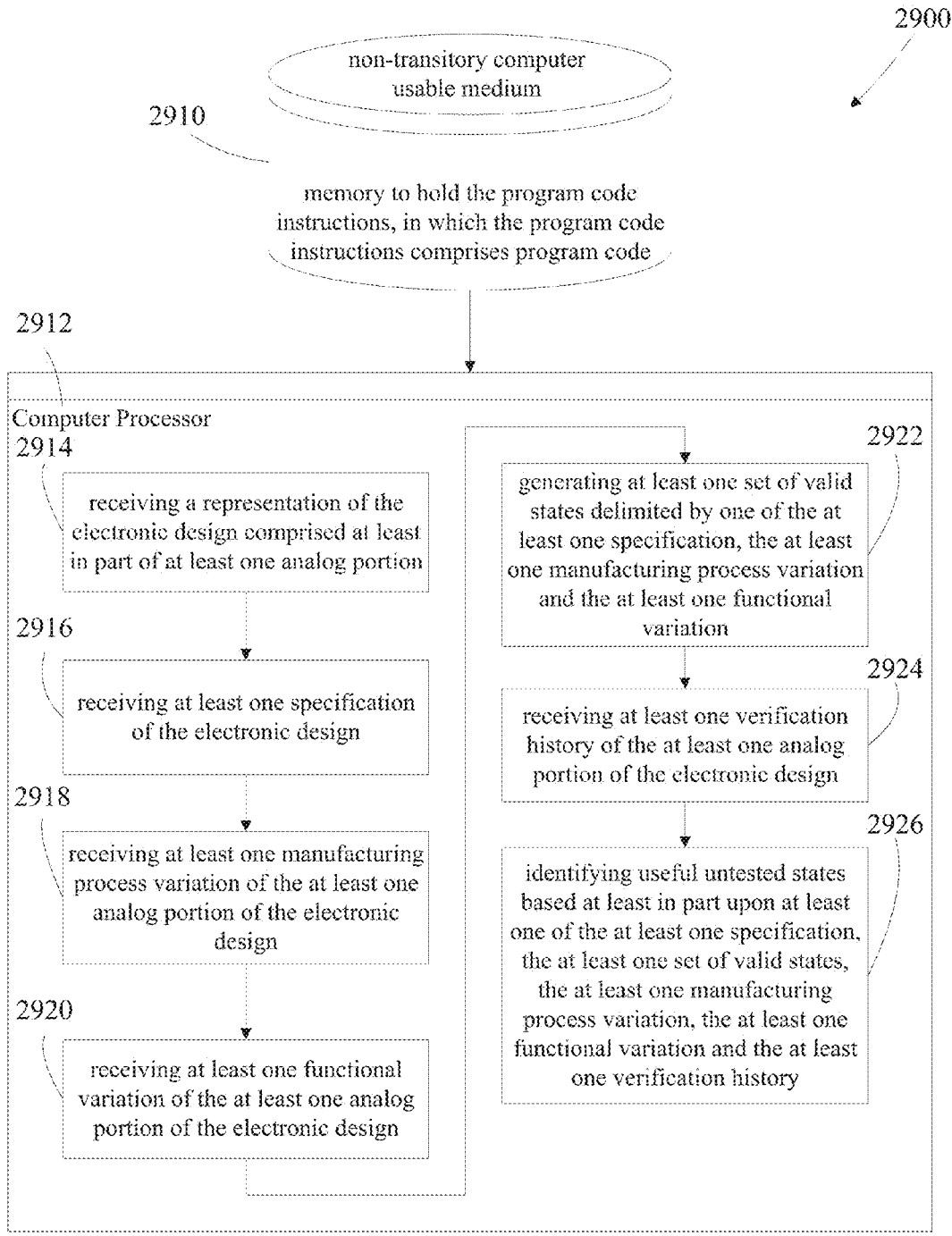
FIG. 29 depicts a sixth example of a computer-based system of identification of useful untested states of an electronic design.

In a sixth example, FIG. 29 illustrates a manufacturing inclusive review of the verification coverage of an analog or mixed signal design. In this example not only the specification is taken into account, but also manufacturing process variations that will likely be encountered and probable functional variations encountered post manufacturing. In this example the computer program product 2900 is embodied on a non-transitory computer usable medium 2910, the non-transitory computer usable medium having stored thereon a sequence of instructions which, when executed by a processor 2912 causes the processor to execute a method of identification of useful untested states of an electronic design, comprising the steps of, receiving 2914 a representation of the electronic design comprised at least in part of at least one analog portion, receiving 2916 at least one specification of the electronic design, receiving 2918 at least one manufacturing process variation of the at least one analog portion of the electronic design and receiving 2920 at least one functional variation of the at least one analog portion of the electronic design. The computer program product also comprises the steps of generating 2922 at least one set of valid states delimited by one of the at least one specification, the at least one manufacturing process variation and the at least one functional variation, receiving 2924 at least one verification history of the at least one analog portion of the electronic design and identifying 2926 useful untested states based at least in part upon at least one of the at least one specification, the at least one set of valid states, the at least one manufacturing process variation, the at least one functional variation and the at least one verification history. The product may also include the step of assessing a verification completeness based at least in part upon the at least one verification history and the at least one set of valid states.

Figure 30:
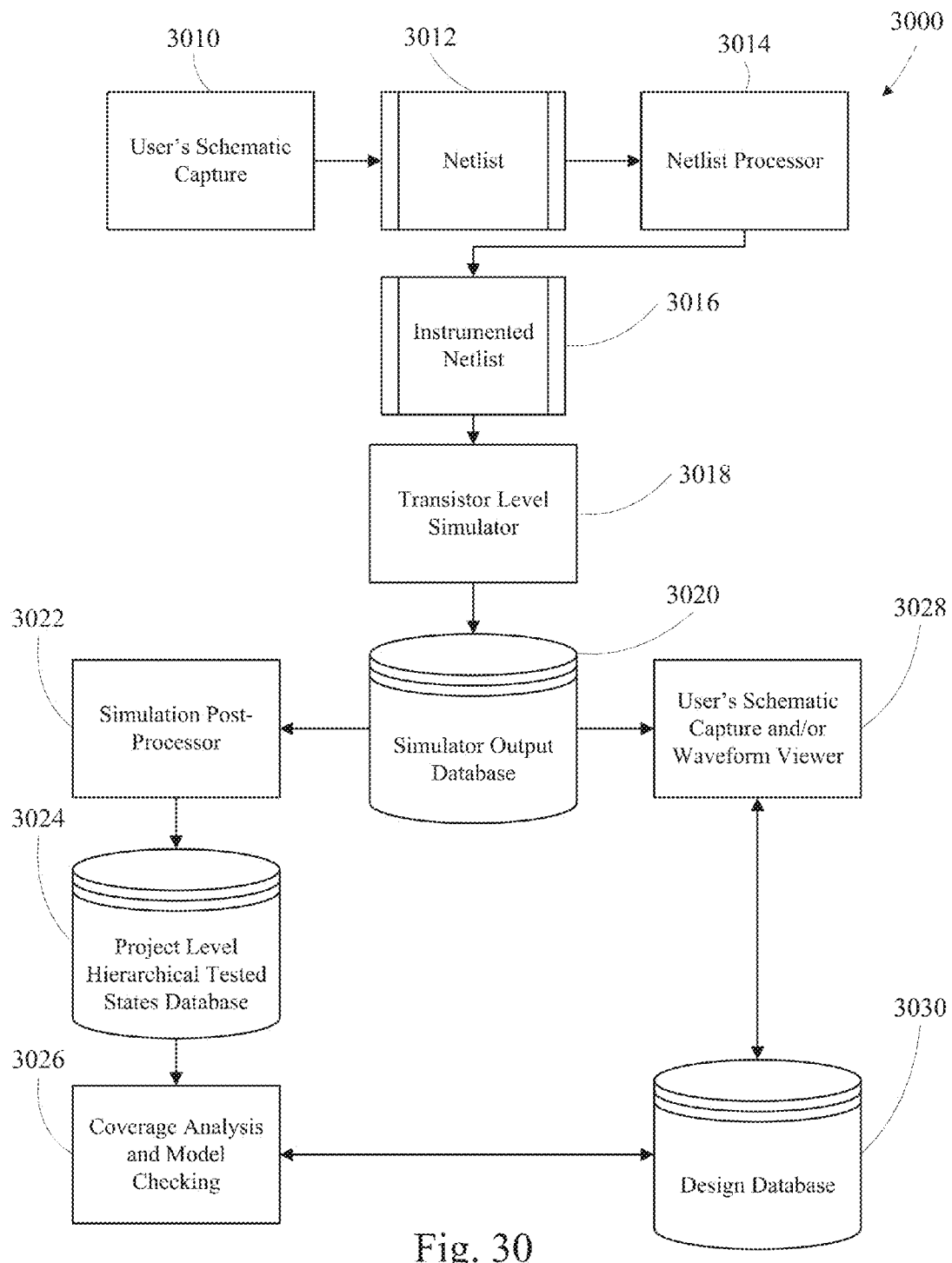
FIG. 30 depicts an example system diagram for identification of useful untested states of an electronic design.

FIG. 30 illustrates an example system diagram 3000 for identification of useful untested states of an electronic design. A user's schematic capture module 3010 captures a representation of the electronic design. A netlist is generated 3012 from the captured schematic and the netlist is processed by a netlist processor 3014. The netlist is subsequently instrumented 3016 to allow inputs and outputs at netlist nodes to be independently captured and a simulation is performed at a transistor level by a transistor level simulator 3018. Data from the simulator is stored in a simulator output database 3020. The simulation output data is post processed by a simulation post processor 3022, which feeds the data into a project level hierarchical tested states database 3024. A coverage analysis and model checking module 3026 receives data from the project level hierarchical tested states database. The data from the simulator output database may also be sent to the user's schematic capture and/or waveform viewer 3028 which feeds data to the design database 3030. The design database may also send and receive data from the project level hierarchical tested states database.

Although the examples have been directed to analog electronic testing, the methods, system and computer readable media may be applied to electro-mechanical, electro-chemical and electro-biological verification and testing.

While the making and using of various exemplary examples of the disclosure are discussed herein, it is to be appreciated that the present disclosure provides concepts which can be described in a wide variety of specific contexts. Although the disclosure has been shown and described with respect to a certain example, it is obvious that equivalents and modifications will occur to others skilled in the art upon the reading and understanding of the specification. The present disclosure includes such equivalents and modifications, and is limited only by the scope of the following claims.

It is to be understood that the method and apparatus may be practiced locally, distributed or remotely and that the data for steps may be stored either locally or remotely. For purposes of clarity, detailed descriptions of functions, components, and systems familiar to those skilled in the applicable arts are not included. The methods and apparatus of the disclosure provide one or more advantages including which are not limited to, improved speed efficiency, decreased computation time, decreased number of re-verifications and the like. While the disclosure has been described with reference to certain illustrative examples, those described herein are not intended to be construed in a limiting sense. For example, variations or combinations of steps in the examples shown and described may be used in particular cases while not departing from the disclosure. Various modifications and combinations of the illustrative examples as well as other advantages and examples will be apparent to persons skilled in the arts upon reference to the drawings, description, and claims.

What is claimed is:

1. A computer implemented method of instrumentation of an electronic design, comprising:
   receiving by a computer a computer readable representation of said electronic design having at least in one part of said electronic design, at least one digital portion and at least one analog portion;
   generating at least one instrumented netlist based at least in part upon said representation of said electronic design;
   receiving at least one specification of said electronic design;
   generating at least one set of valid states based on said at least one specification;
   receiving at least one verification coverage history of said electronic design;
   correlating said at least one verification coverage history and at least one input vector; and
   assessing completeness of verification based at least in part upon at least one of said at least one specification, said at least one instrumented netlist, said at least one set of valid states and said at least one verification coverage history.

2. The computer implemented method of instrumentation of said electronic design of claim 1, further comprising determining a minimum number of said at least one input vector to maximize said assessing completeness of verification.

3. The computer implemented method of instrumentation of said electronic design of claim 2, further comprising simulating at a behavioral level of said representation of said electronic design said minimum number of said at least one input vector.

4. The computer implemented method of instrumentation of said electronic design of claim 3, further comprising assessing a measurement output at said behavioral level simulation, wherein said assessment is based at least in part upon said at least one set of valid states.

5. The computer implemented method of instrumentation of said electronic design of claim 4, further comprising simulating at a transistor level of said representation of said electronic design said minimum number of said at least one input vector.

6. The computer implemented method of instrumentation of said electronic design of claim 5, further comprising correlating said measurement output at said transistor level simulation, wherein said correlation is based at least in part upon said measurement output at said behavioral level simulation.

7. A computer program embodied on a non-transitory computer useable medium, said non-transitory computer usable medium having stored thereon a sequence of instructions which, when executed by a processor causes a computer to execute a method of instrumentation of an electronic design, comprising the steps of:
receiving by said computer a computer readable representation of said electronic design having at least in one part of said electronic design, at least one digital portion and at least one analog portion;
generating at least one instrumented netlist based at least in part upon said representation of said electronic design;
receiving at least one specification of said electronic design;
generating at least one set of valid states based on said at least one specification;
receiving at least one verification coverage history of said electronic design;
correlating said at least one verification coverage history and at least one input vector; and
assessing completeness of verification based at least in part upon at least one of said at least one specification, said at least one instrumented netlist, said at least one set of valid states and said at least one verification coverage history.

8. The computer product of claim 7, further comprising determining a minimum number of said at least one input vector to maximize said assessing completeness of verification.

9. The computer product of claim 8, further comprising simulating at a behavioral level of said representation of said electronic design said minimum number of said at least one input vector.

10. The computer product of claim 9, further comprising assessing a measurement output at said behavioral level simulation, wherein said assessment is based at least in part upon said at least one set of valid states.

11. The computer product of claim 10, further comprising simulating at a transistor level of said representation of said electronic design said minimum number of said at least one input vector.

12. The computer product of claim 11, further comprising correlating said measurement output at said transistor level simulation, wherein said correlation is based at least in part upon said measurement output at said behavioral level simulation.

* * * * *